(12) United States Patent
Yang et al.

(10) Patent No.: US 9,754,946 B1
(45) Date of Patent: Sep. 5, 2017

(54) METHODS OF FORMING AN ELEVATIONALLY EXTENDING CONDUCTOR LATERALLY BETWEEN A PAIR OF CONDUCTIVE LINES

(71) Applicant: Micron Technology, Inc., Boise, ID (US)

(72) Inventors: Guangjun Yang, Meridian, ID (US); Russell A. Benson, Boise, ID (US); Brent Gilgen, Boise, ID (US); Alex J. Schrinsky, Boise, ID (US); Sanh D. Tang, Kuna, ID (US); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/210,511

(22) Filed: Jul. 14, 2016

(51) Int. Cl.
*H01L 21/768* (2006.01)
*H01L 27/108* (2006.01)

(52) U.S. Cl.
CPC .... *H01L 27/10885* (2013.01); *H01L 21/7682* (2013.01); *H01L 21/76816* (2013.01); *H01L 21/76877* (2013.01)

(58) Field of Classification Search
None
See application file for complete search history.

(56) References Cited

U.S. PATENT DOCUMENTS

| 2010/0285662 | A1 | 11/2010 | Kim et al. | |
|---|---|---|---|---|
| 2011/0266689 | A1* | 11/2011 | Tang | H01L 21/7682 257/773 |
| 2014/0001650 | A1* | 1/2014 | Trivedi | H01L 21/7682 257/774 |
| 2014/0231892 | A1 | 8/2014 | Song et al. | |
| 2015/0061134 | A1 | 3/2015 | Lee et al. | |
| 2015/0262625 | A1 | 9/2015 | Han et al. | |

* cited by examiner

*Primary Examiner* — Asok K Sarkar
(74) *Attorney, Agent, or Firm* — Wells St. John, P.S.

(57) ABSTRACT

A method of forming an elevationally extending conductor laterally between a pair of conductive lines comprises forming a pair of conductive lines spaced from one another in at least one vertical cross-section. Conductor material is formed to elevationally extend laterally between and cross elevationally over the pair of conductive lines in the at least one vertical cross-section. Sacrificial material is laterally between the elevationally extending conductor material and each of the conductive lines of the pair in the at least one vertical cross-section. The sacrificial material is removed from between the elevationally extending conductor material and each of the conductive lines of the pair while the conductor material is crossing elevationally over the pair of conductive lines to form a void space laterally between the elevationally extending conductor material and each of the conductive lines of the pair in the at least one vertical cross-section.

25 Claims, 43 Drawing Sheets

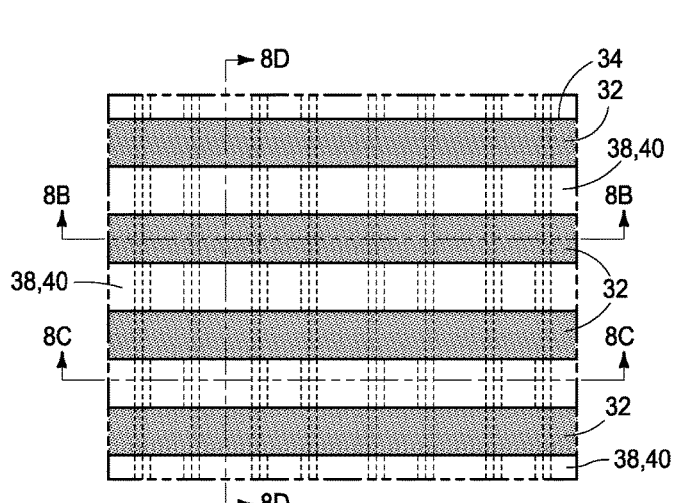
FIG. 8A
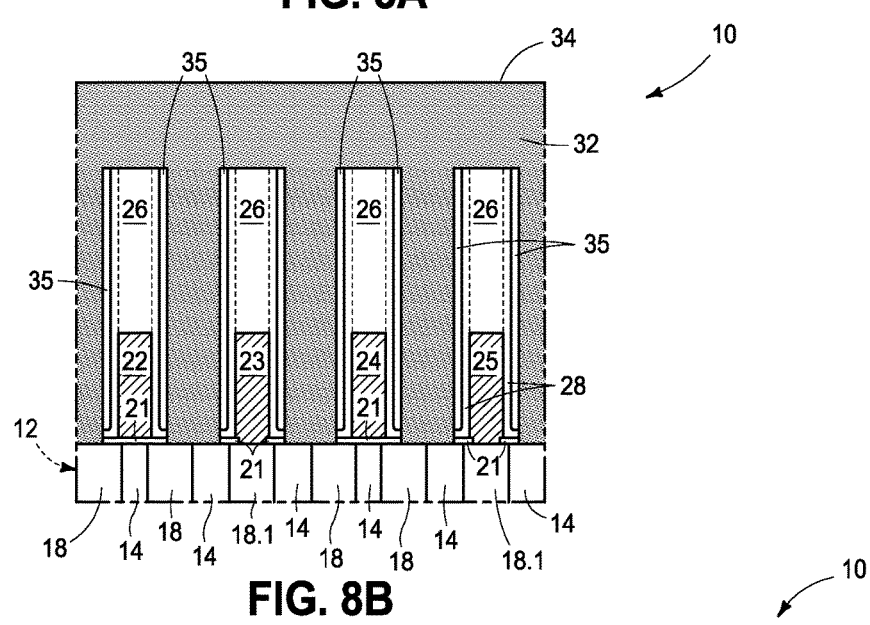
FIG. 8B
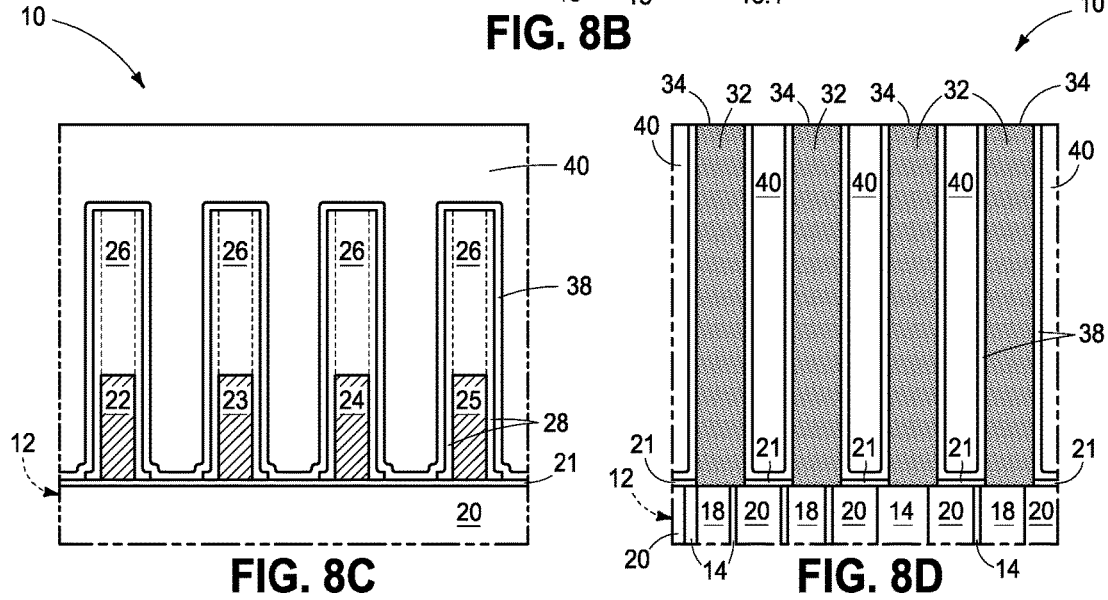
FIG. 8C
FIG. 8D

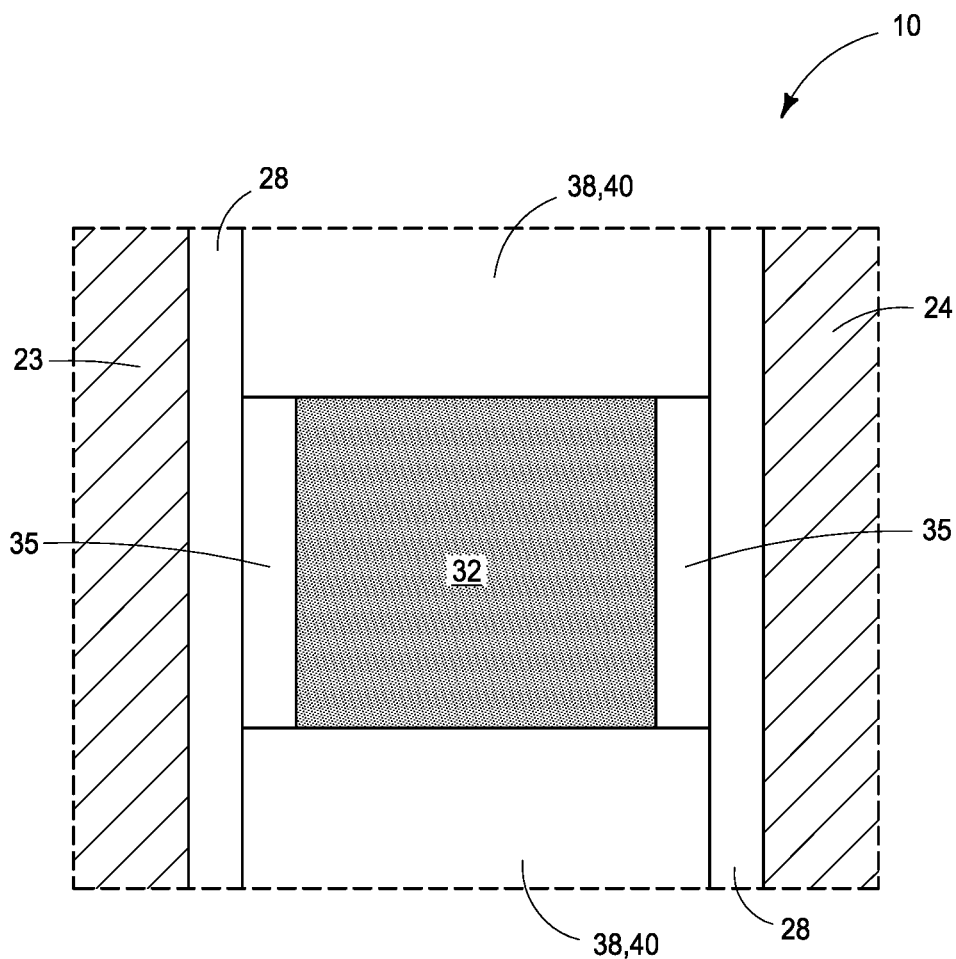
FIG. 10.1

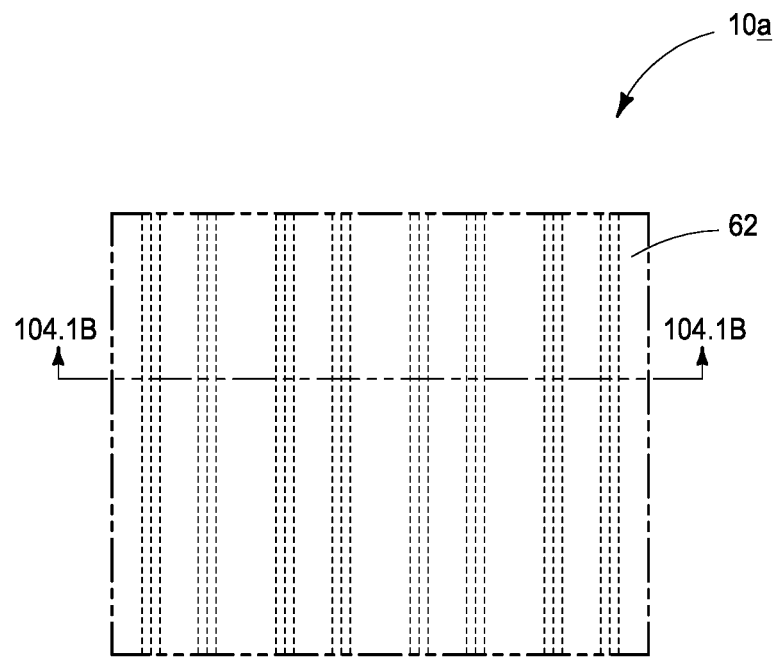
FIG. 104.1A
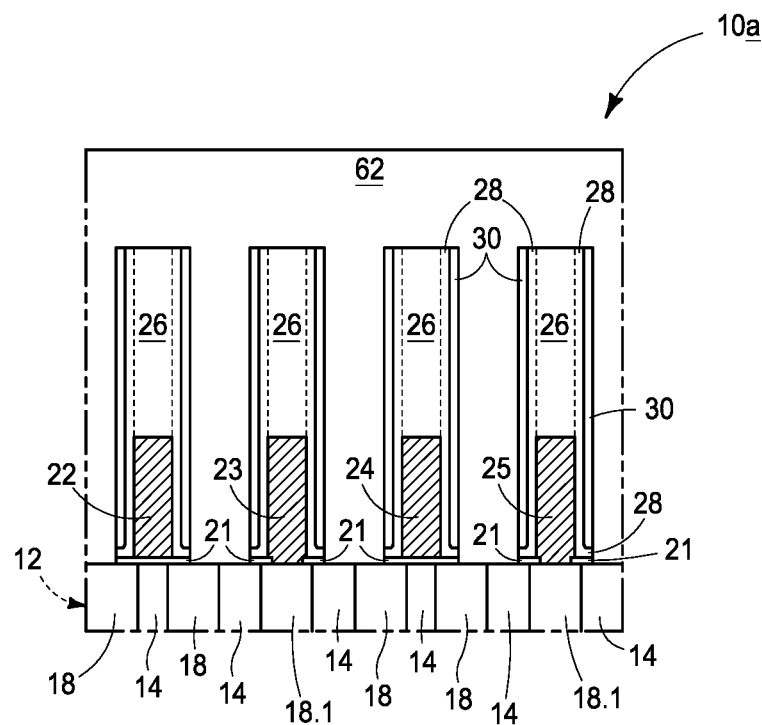
FIG. 104.1B

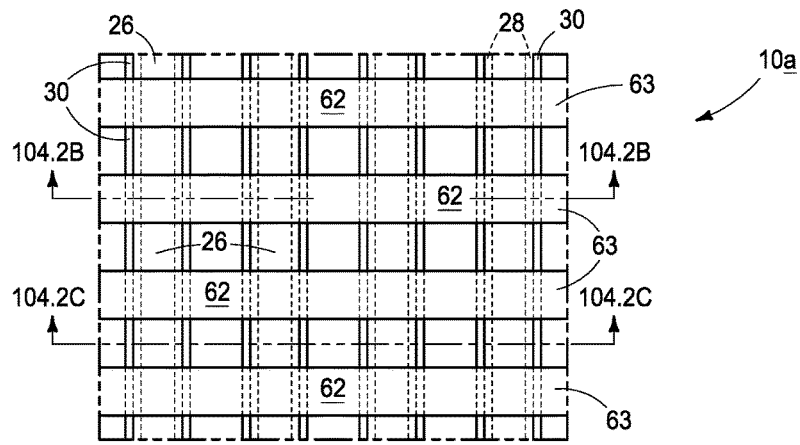
FIG. 104.2A
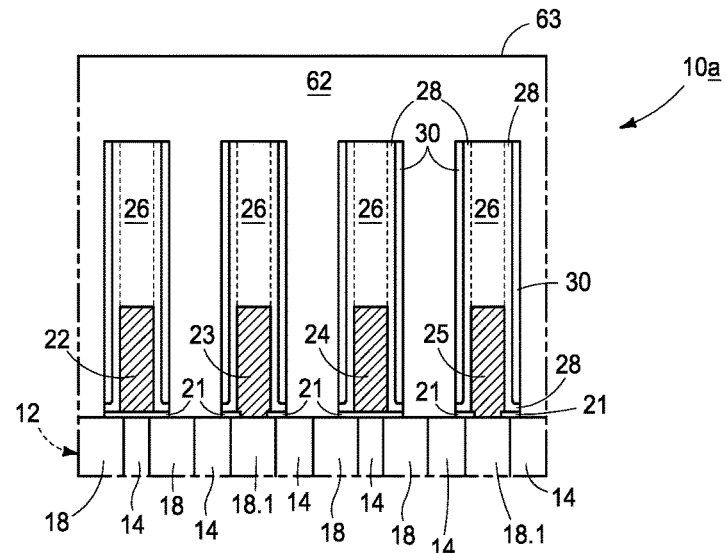
FIG. 104.2B
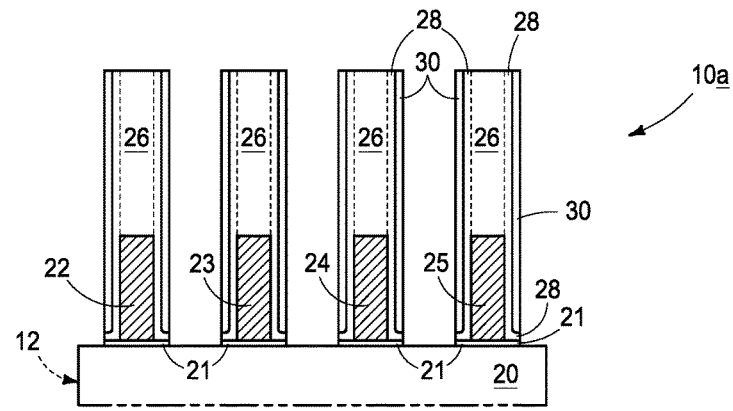
FIG. 104.2C

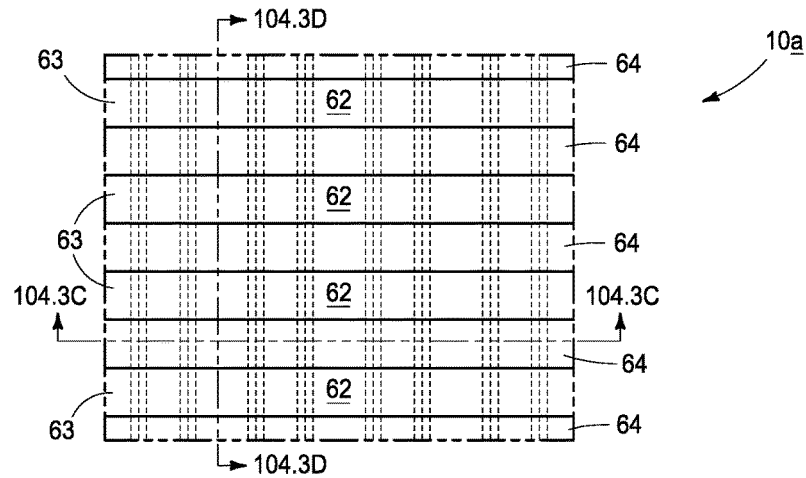
FIG. 104.3A
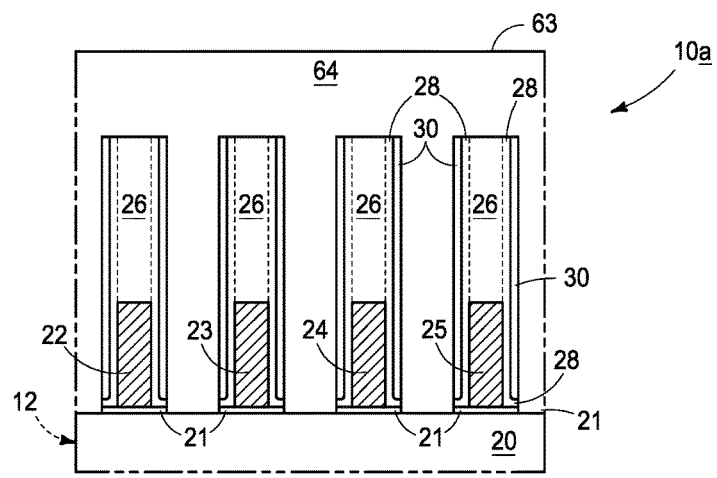
FIG. 104.3C
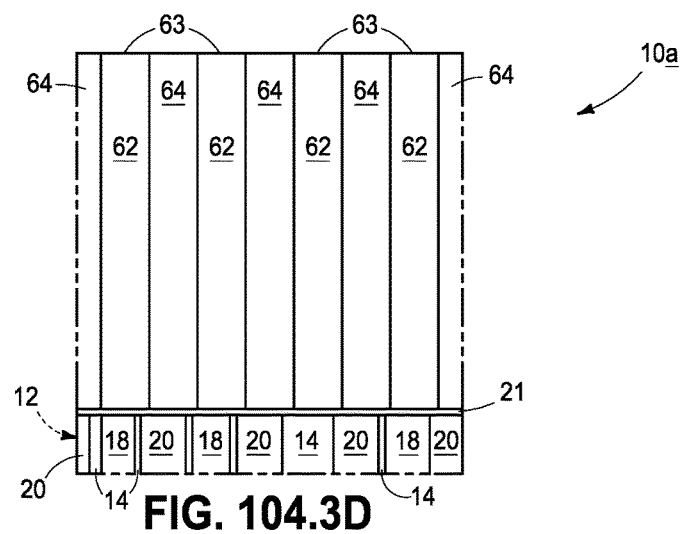
FIG. 104.3D

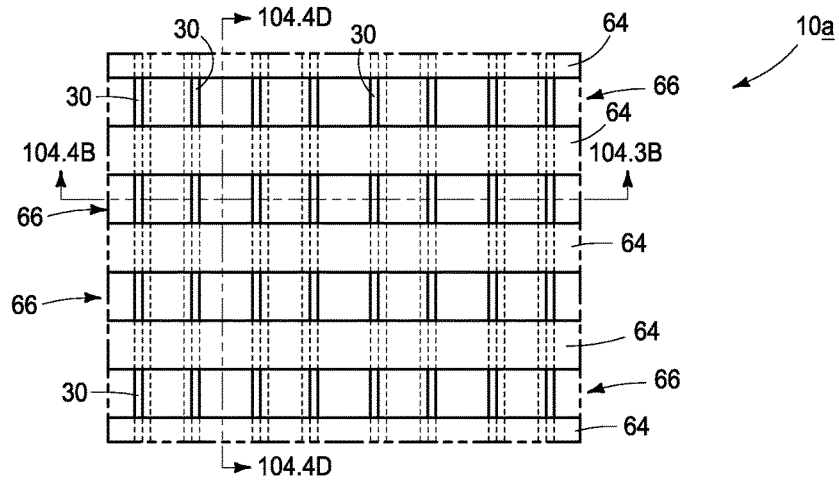
FIG. 104.4A
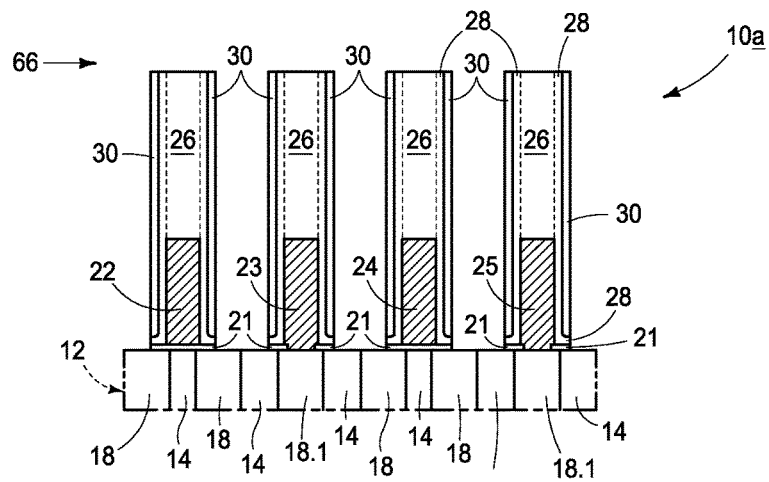
FIG. 104.4B
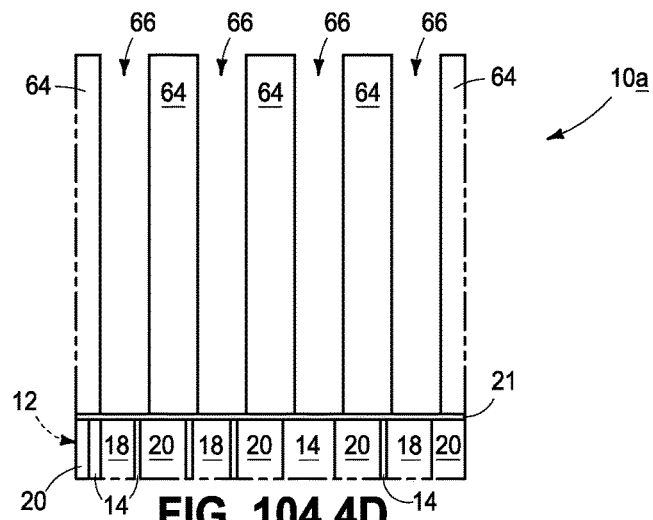
FIG. 104.4D

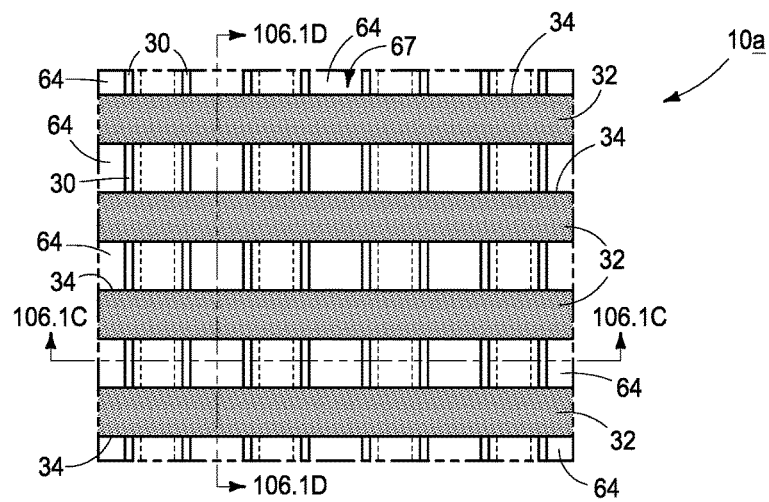
FIG. 106.1A
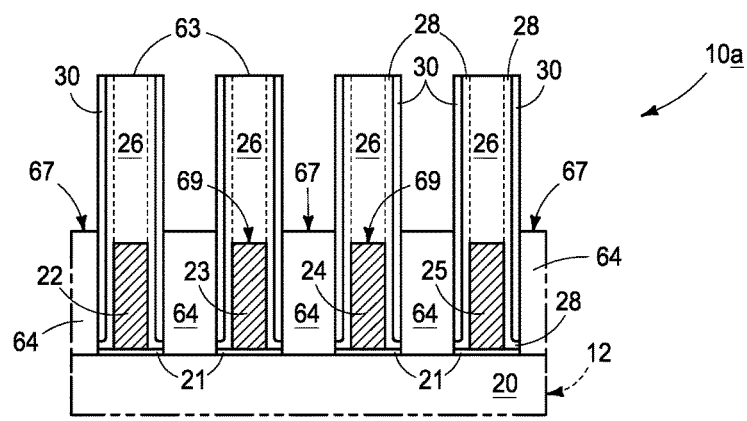
FIG. 106.1C
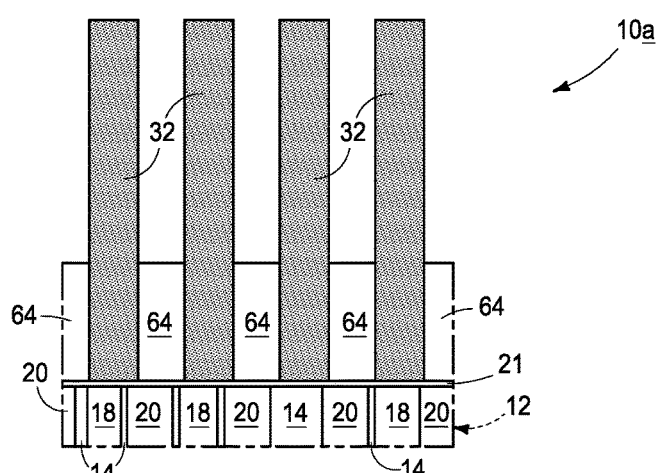
FIG. 106.1D

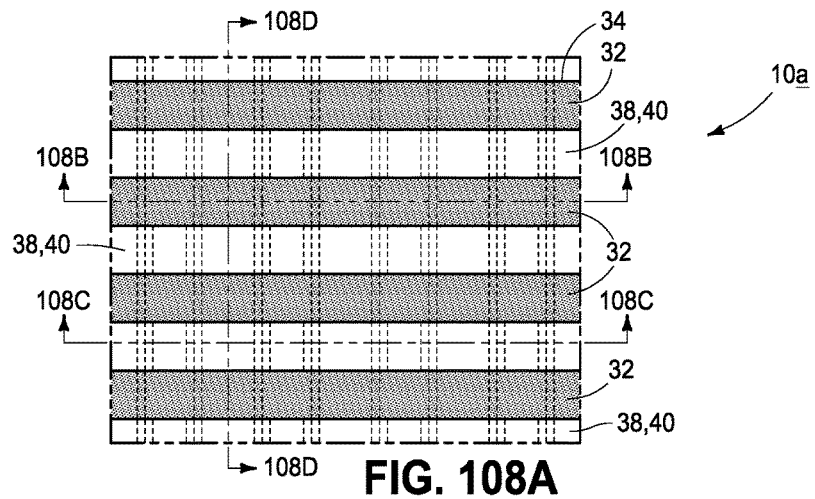
FIG. 108A
FIG. 108B
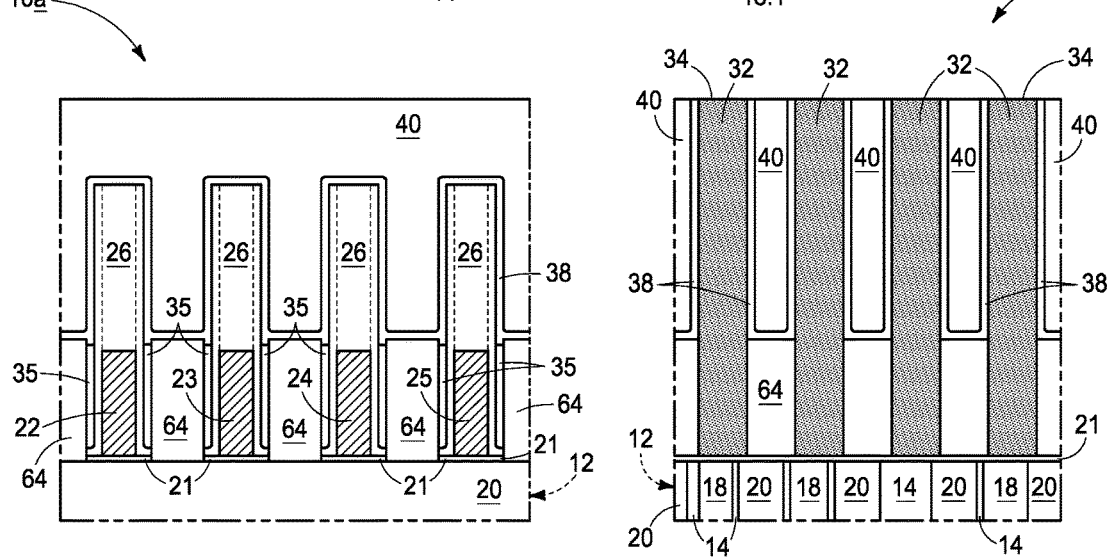
FIG. 108C
FIG. 108D

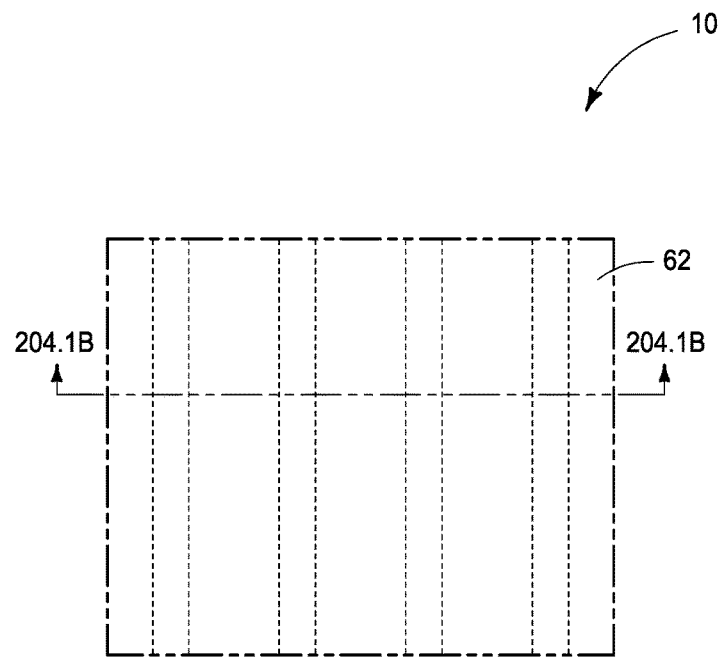
FIG. 204.1A
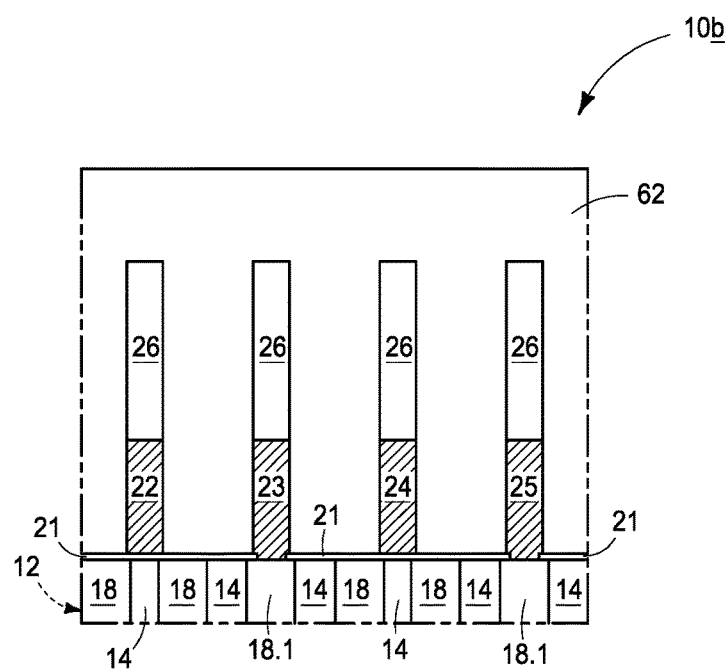
FIG. 204.1B

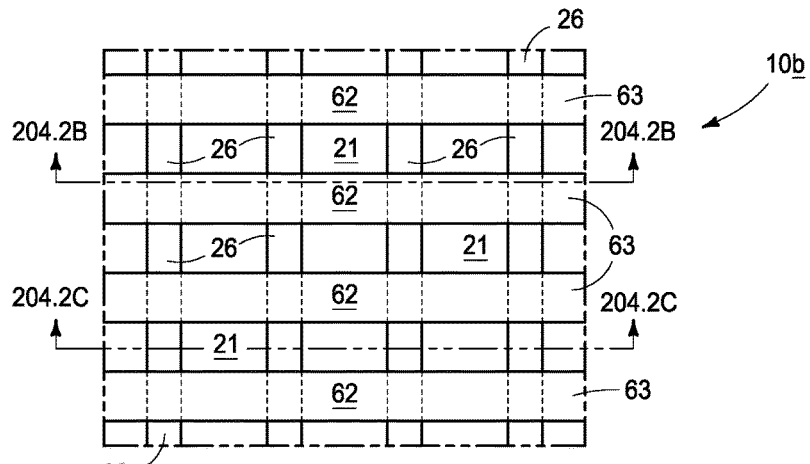
FIG. 204.2A
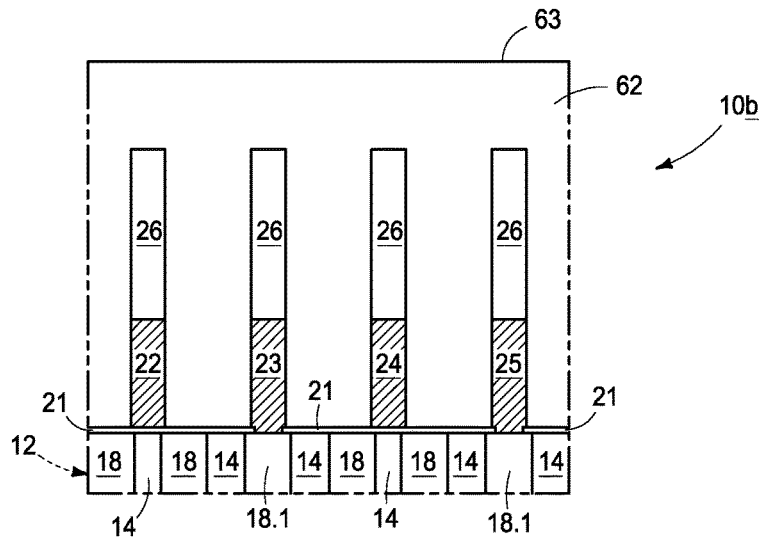
FIG. 204.2B
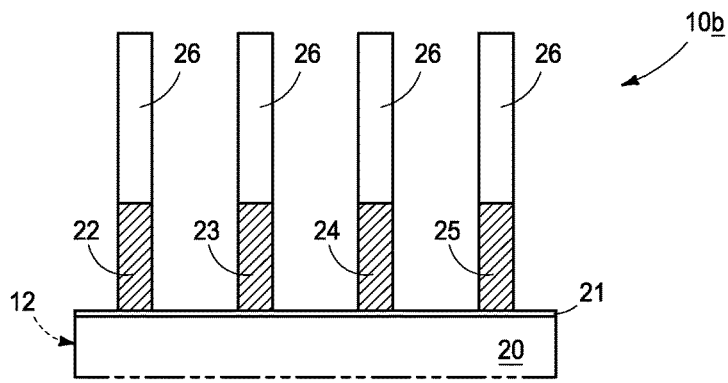
FIG. 204.2C

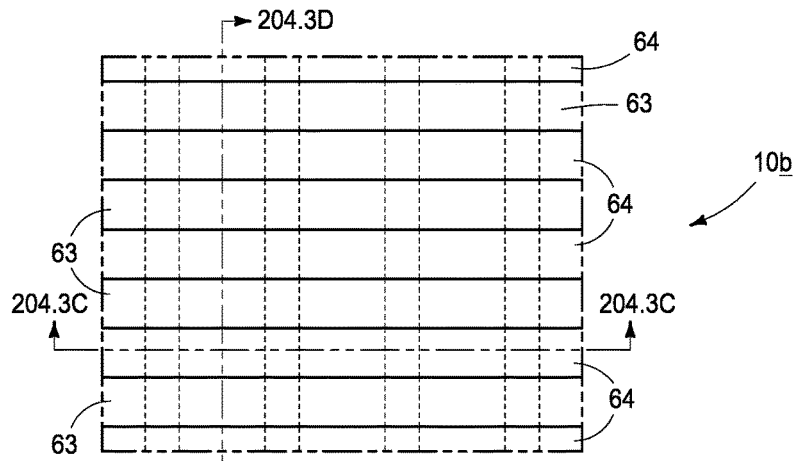
FIG. 204.3A
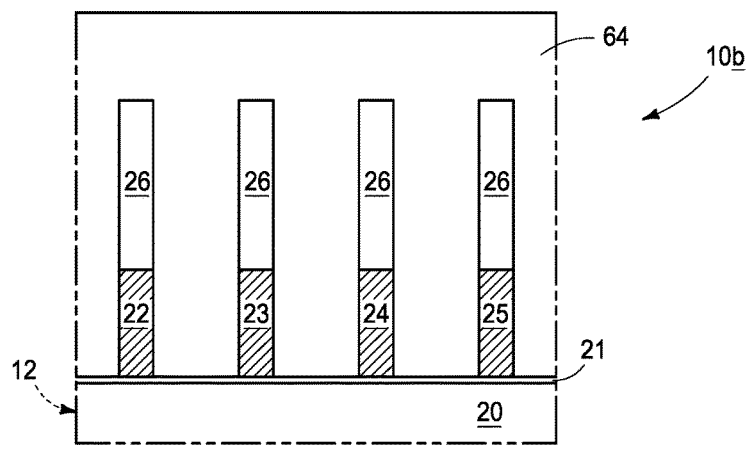
FIG. 204.3C
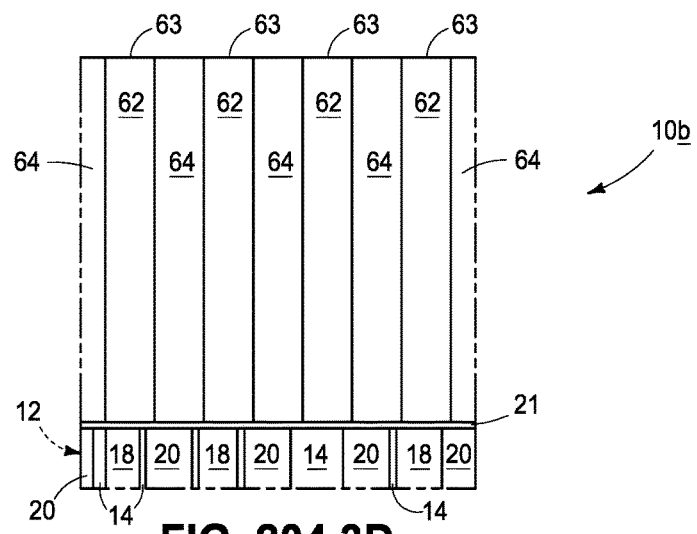
FIG. 204.3D

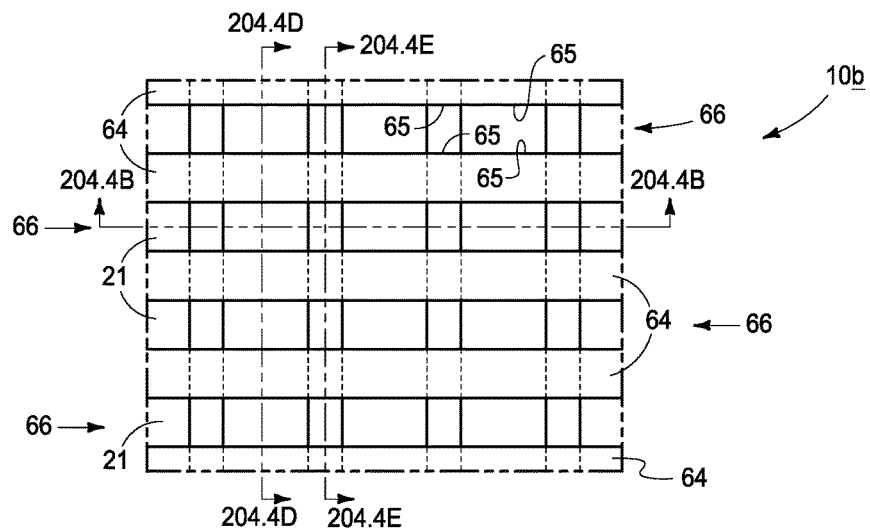
FIG. 204.4A
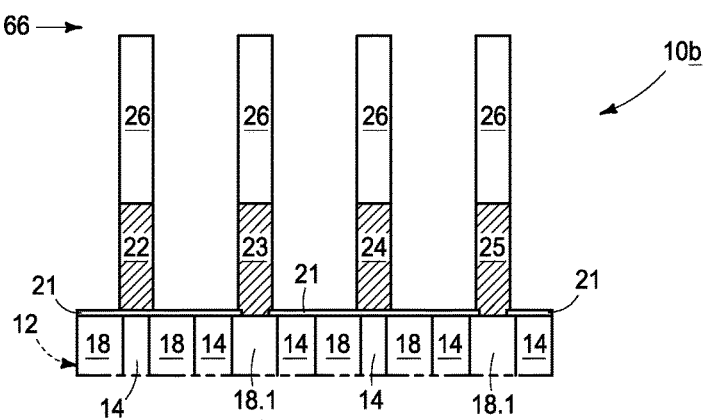
FIG. 204.4B
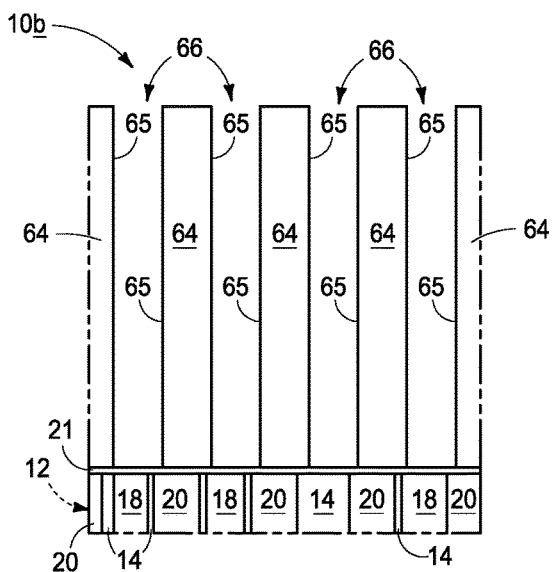
FIG. 204.4D
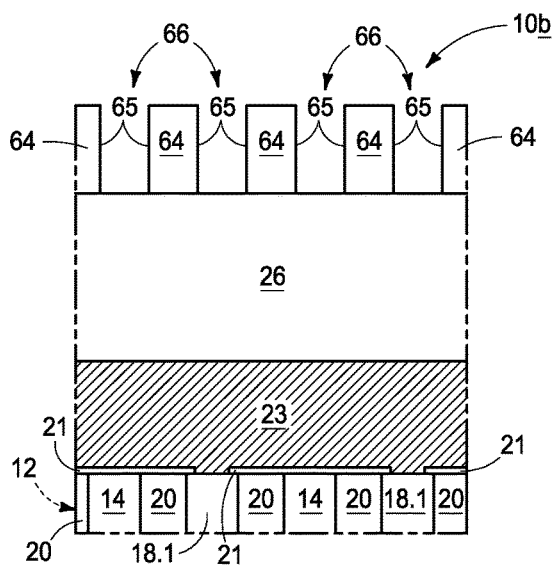
FIG. 204.4E

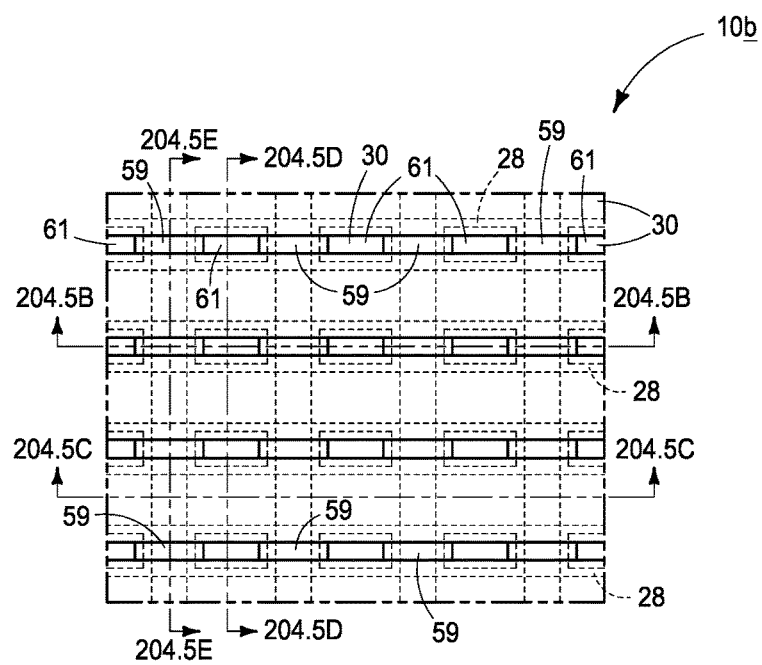
FIG. 204.5A
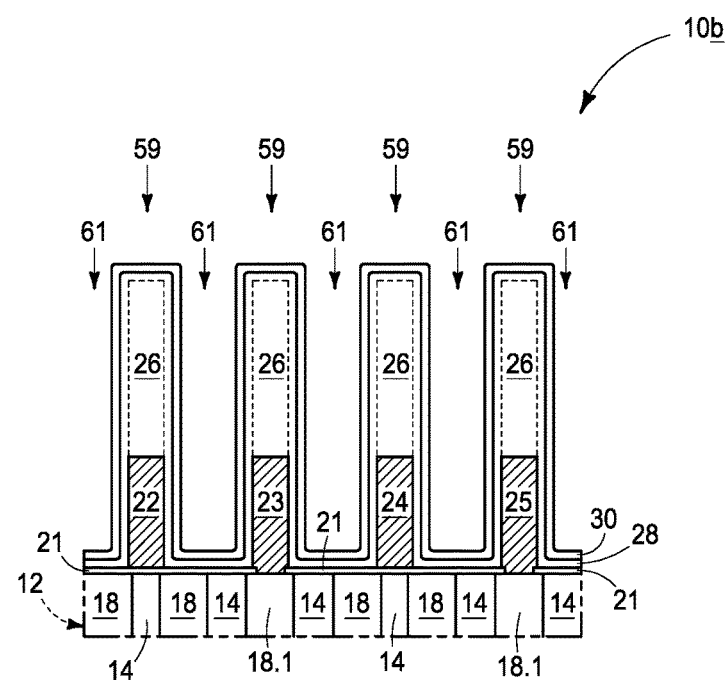
FIG. 204.5B

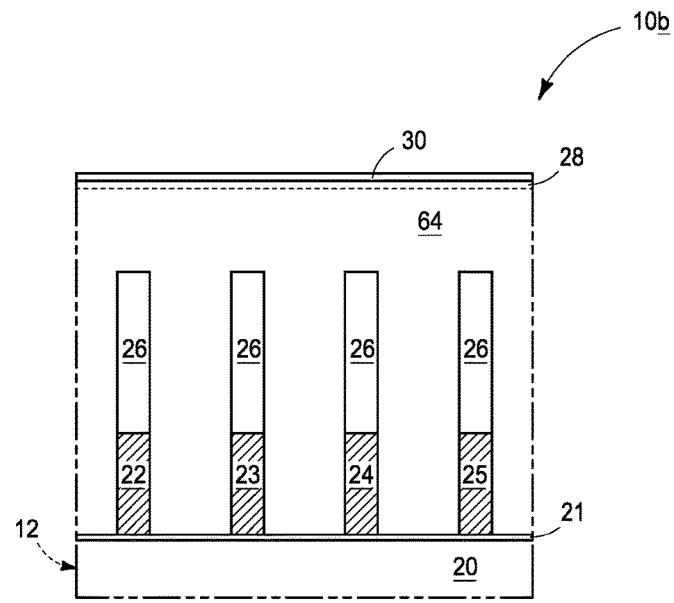
FIG. 204.5C
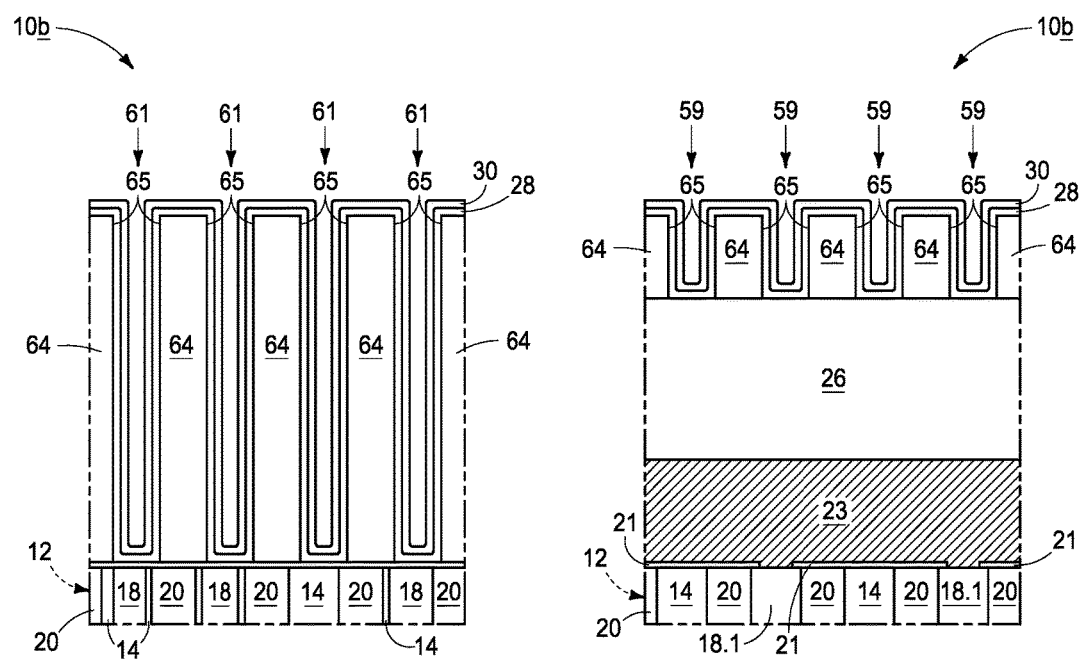
FIG. 204.5D  FIG. 204.5E

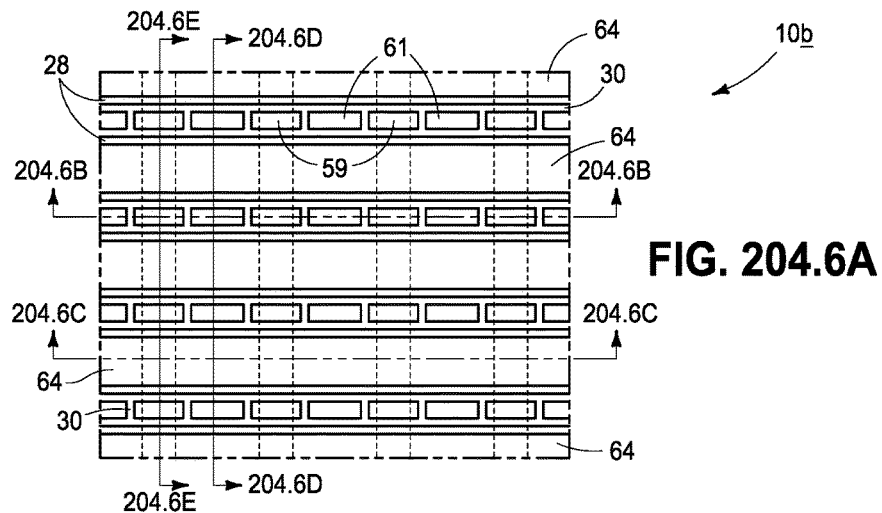
FIG. 204.6A
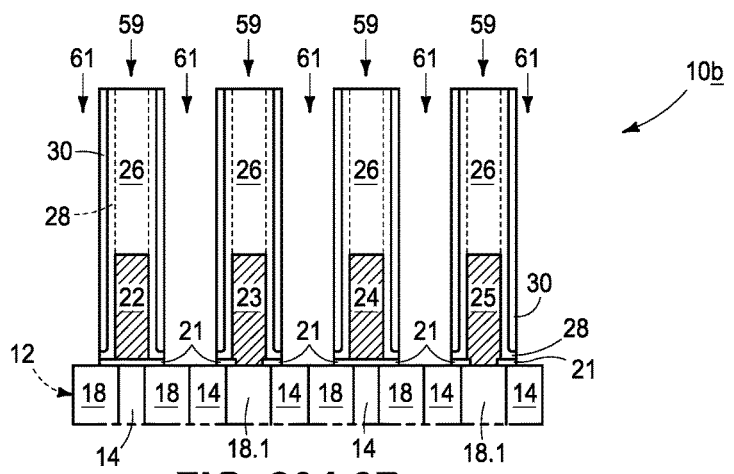
FIG. 204.6B
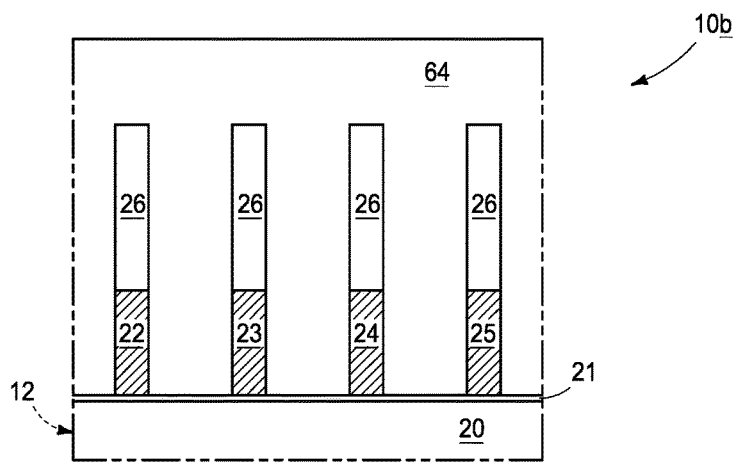
FIG. 204.6C

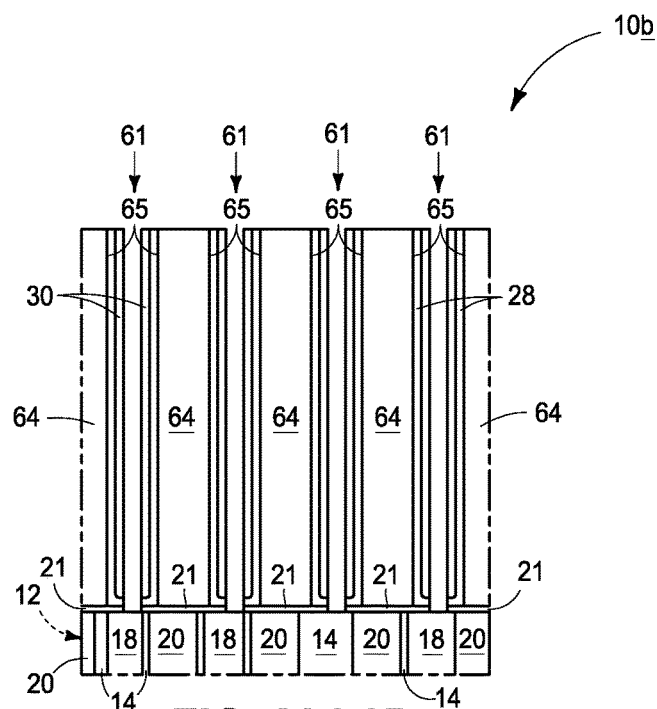
FIG. 204.6D
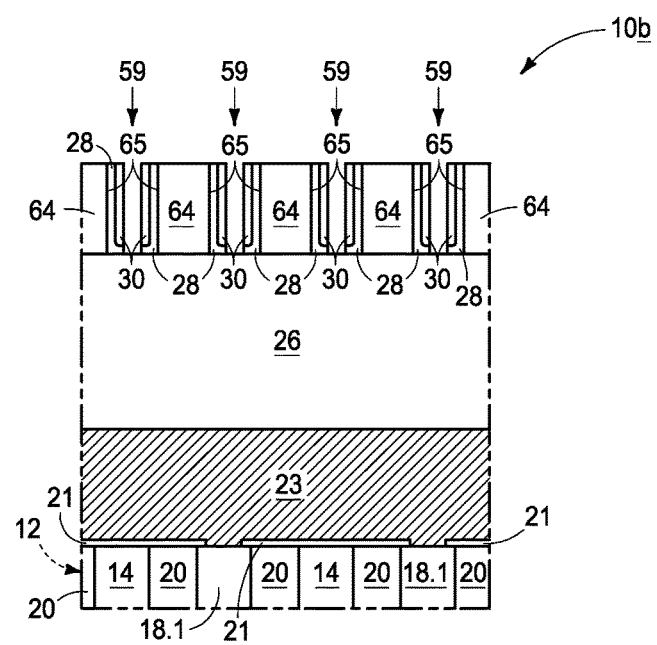
FIG. 204.6E

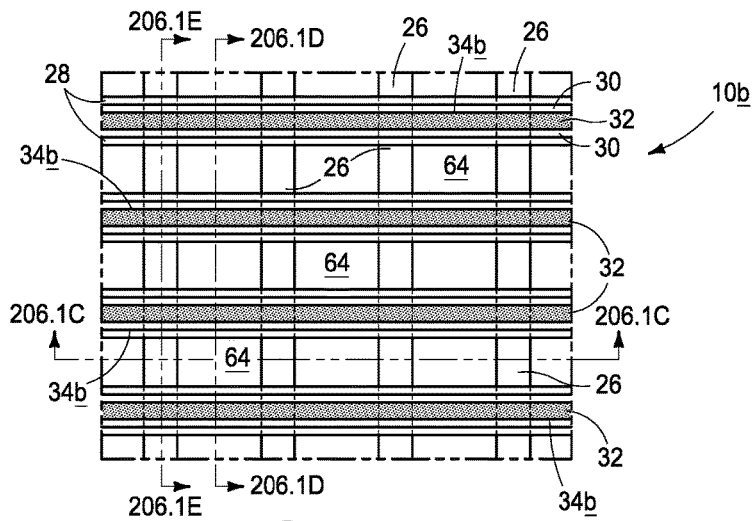
FIG. 206.1A
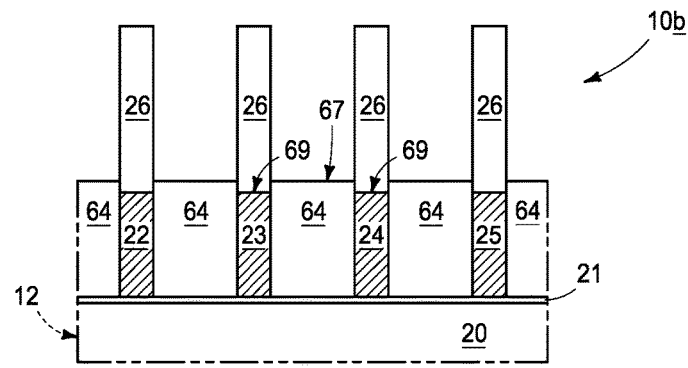
FIG. 206.1C
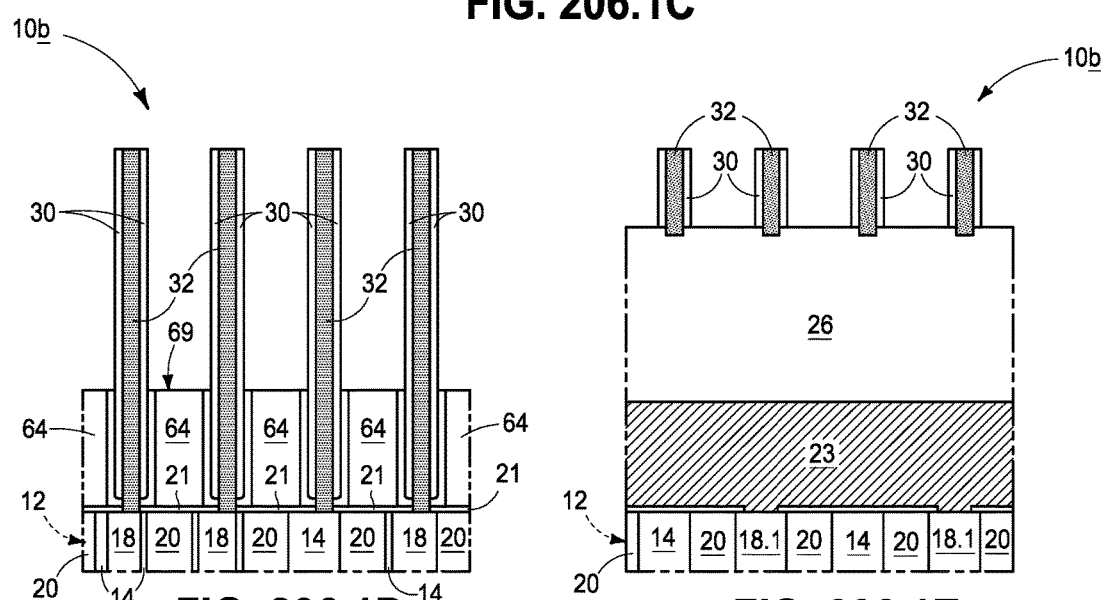
FIG. 206.1D
FIG. 206.1E

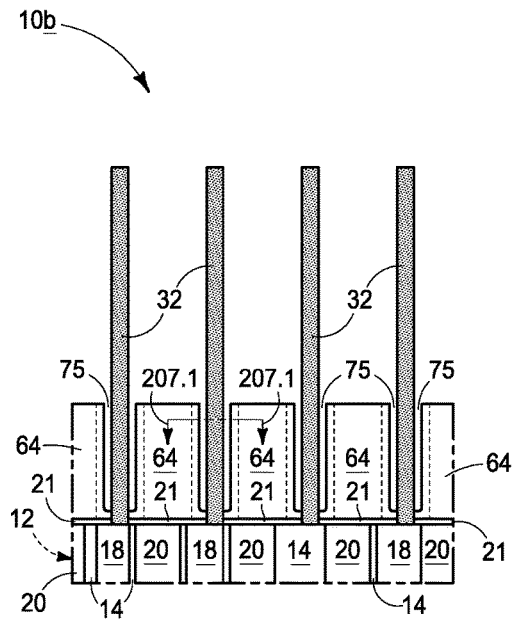
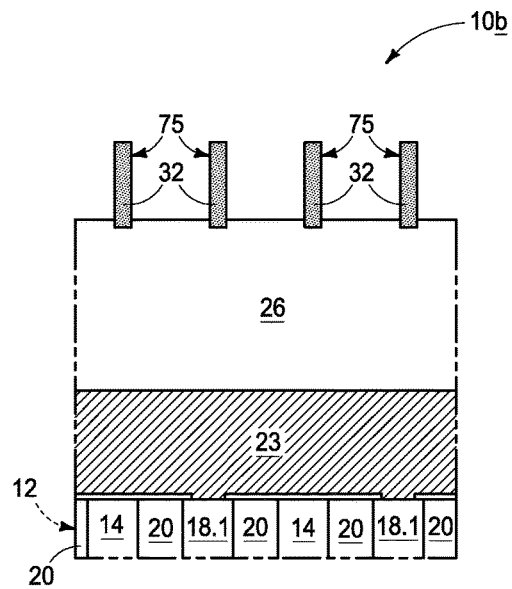
FIG. 207D    FIG. 207E
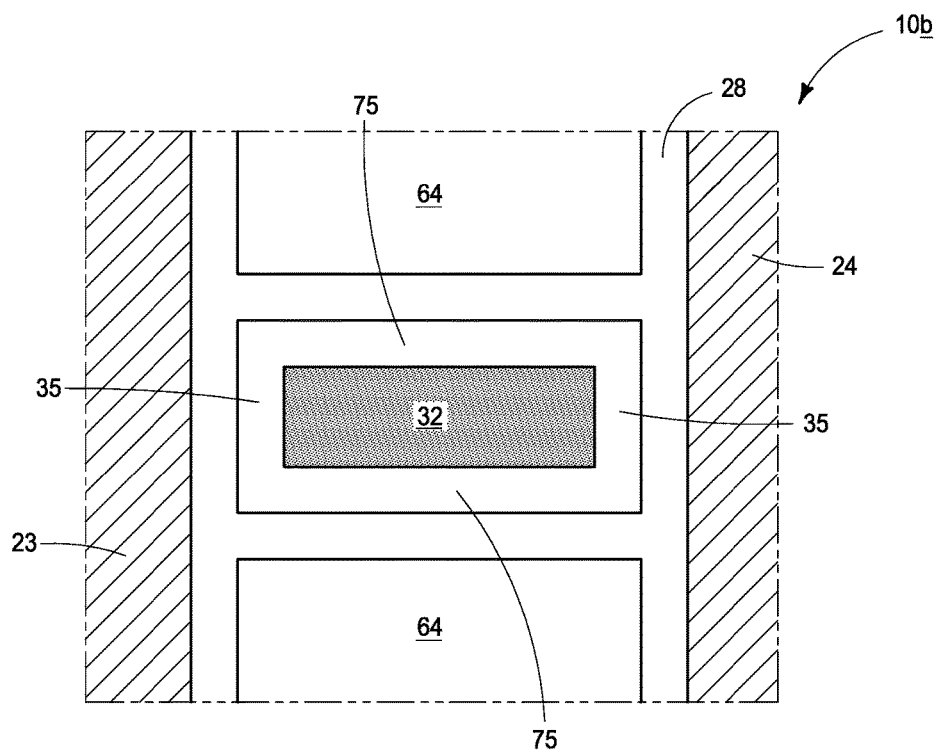
FIG. 207.1

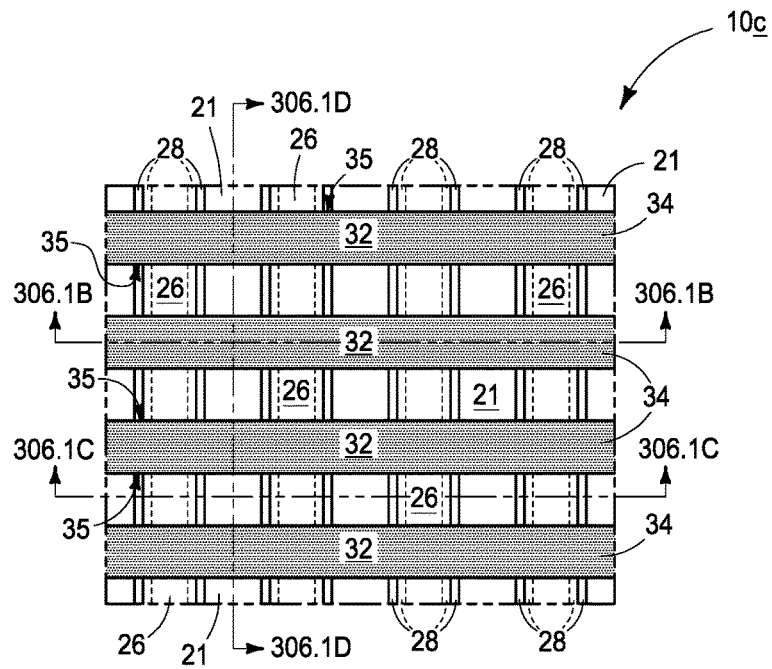
FIG. 306.1A
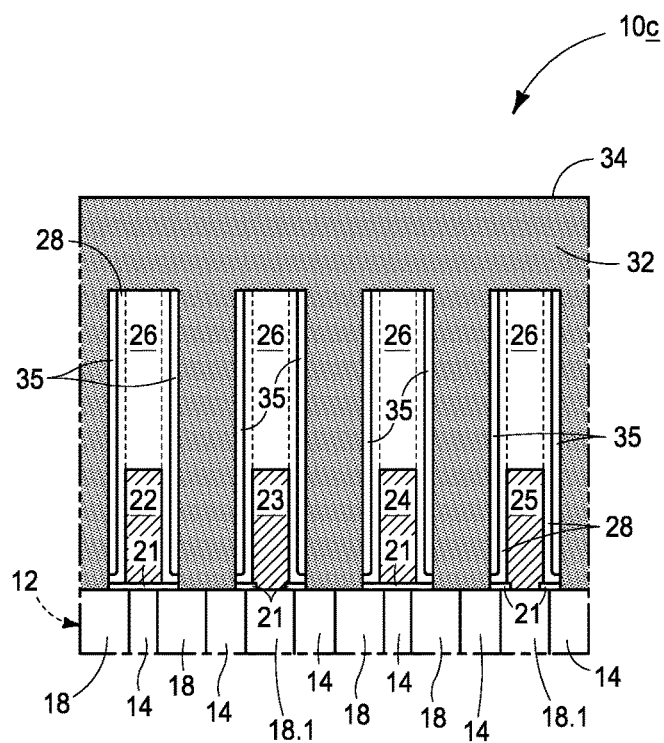
FIG. 306.1B

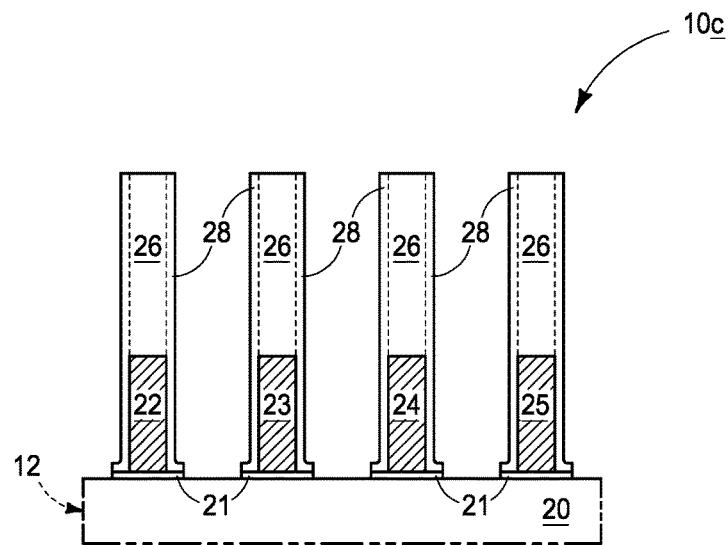
FIG. 306.1C
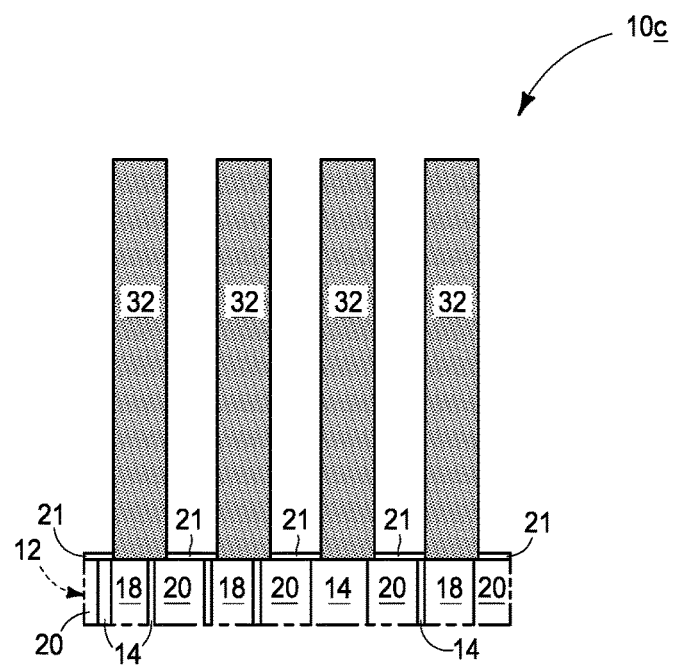
FIG. 306.1D

US 9,754,946 B1

METHODS OF FORMING AN ELEVATIONALLY EXTENDING CONDUCTOR LATERALLY BETWEEN A PAIR OF CONDUCTIVE LINES

TECHNICAL FIELD

Embodiments disclosed herein pertain to methods of forming an elevationally extending conductor laterally between a pair of conductive lines.

BACKGROUND

A continuing goal in integrated circuitry fabrication is to make ever smaller and closer packed circuit components. As integrated circuit density has increased, there is often greater reduction in the horizontal dimension of circuit components as compared to the vertical dimension. In many instances, the vertical dimension has increased. Elevationally extending conductors are commonly used to electrically couple circuit components that are at different elevations relative to one another.

Many times, the conductors extend elevationally between two conductive lines and have very large aspect ratios (height to width). Historically, the conductors having been separated from the conductive lines solely by solid dielectric material. More recently, an air gap has been proposed to be part of the dielectric material separating both sides of an elevationally extending conductor from the immediately adjacent conductive lines. It can be difficult to maintain tall conductors upright while forming and sealing such air gaps.

BRIEF DESCRIPTION OF THE DRAWINGS

FIG. 8A is a view of the FIG. 7A substrate at a processing step subsequent to that shown by FIG. 7A.

FIG. 8B is a sectional view taken through line 8B-8B in FIG. 8A.

FIG. 8C is a sectional view taken through line 8C-8C in FIG. 8A.

FIG. 8D is a sectional view taken through line 8D-8D in FIG. 8A.

FIG. 10.1 is an enlarged sectional view of a portion of the FIG. 10A substrate taken through line 10.1-10.1 in FIG. 10B.

FIG. 104.1A is a diagrammatic top view of a semiconductor substrate in process in accordance with an embodiment of the invention.

FIG. 104.1B is a sectional view taken through line 104.1B-104.1B in FIG. 104.1A.

FIG. 104.2A is a view of the FIG. 104.1A substrate at a processing step subsequent to that shown by FIG. 104.1A.

FIG. 104.2B is a sectional view taken through line 104.2B-104.2B in FIG. 104.2A.

FIG. 104.2C is a sectional view taken through line 104.2C-104.2C in FIG. 104.2A.

FIG. 104.3A is a view of the FIG. 104.2A substrate at a processing step subsequent to that shown by FIG. 104.2A.

FIG. 104.3C is a sectional view taken through line 104.3C-104.3C in FIG. 104.3A.

FIG. 104.3D is a sectional view taken through line 104.3D-104.3D in FIG. 104.3.

FIG. 104.4A is a view of the FIG. 104.3A substrate at a processing step subsequent to that shown by FIG. 104.3A.

FIG. 104.4B is a sectional view taken through line 104.4B-104.4B in FIG. 104.4A.

FIG. 104.4D is a sectional view taken through line 104.4D-104.4D in FIG. 104.4A.

FIG. 106.1A is a view of the FIG. 106A substrate at a processing step subsequent to that shown by FIG. 106A.

FIG. 106.1C is a sectional view taken through line 106.1C-106.1C in FIG. 106.1A.

FIG. 106.1D is a sectional view taken through line 106.1D-106.1D in FIG. 106.1A.

FIG. 108A is a view of the FIG. 107A substrate at a processing step subsequent to that shown by FIG. 107A.

FIG. 108B is a sectional view taken through line 108B-108B in FIG. 108A.

FIG. 108C is a sectional view taken through line 108C-108C in FIG. 108A.

FIG. 108D is a sectional view taken through line 108D-108D in FIG. 108A.

FIG. 204.1A is a diagrammatic top view of a semiconductor substrate in process in accordance with an embodiment of the invention.

FIG. 204.1B is a sectional view taken through line 204.1B-204.1B in FIG. 204.1A.

FIG. 204.2A is a view of the FIG. 204.1A substrate at a processing step subsequent to that shown by FIG. 204.1A.

FIG. 204.2B is a sectional view taken through line 204.2B-204.2B in FIG. 204.2A.

FIG. 204.2C is a sectional view taken through line 204.2C-204.2C in FIG. 204.2A.

FIG. 204.3A is a view of the FIG. 204.2A substrate at a processing step subsequent to that shown by FIG. 204.2A.

FIG. 204.3C is a sectional view taken through line 204.3C-204.3C in FIG. 204.3A.

FIG. 204.3D is a sectional view taken through line 204.3D-204.3D in FIG. 204.3A.

FIG. 204.4A is a view of the FIG. 204.3A substrate at a processing step subsequent to that shown by FIG. 204.3A.

FIG. 204.4B is a sectional view taken through line 204.4B-204.4B in FIG. 204.4A.

FIG. 204.4D is a sectional view taken through line 204.4D-204.4D in FIG. 204.4A.

FIG. 204.4E is a sectional view taken through line 204.4E-204.4E in FIG. 204.4A.

FIG. 204.5A is a view of the FIG. 204.4A substrate at a processing step subsequent to that shown by FIG. 204.4A.

FIG. 204.5B is a sectional view taken through line 204.5B-204.5B in FIG. 204.5A.

FIG. 204.5C is a sectional view taken through line 204.5C-204.5C in FIG. 204.5A.

FIG. 204.5D is a sectional view taken through line 204.5D-204.5D in FIG. 204.5A.

FIG. 204.5E is a sectional view taken through line 204.5E-204.5E in FIG. 204.5A.

FIG. 204.6A is a view of the FIG. 204.5A substrate at a processing step subsequent to that shown by FIG. 204.5A.

FIG. 204.6B is a sectional view taken through line 204.6B-204.6B in FIG. 204.6A.

FIG. 204.6C is a sectional view taken through line 204.6C-204.6C in FIG. 204.6A.

FIG. 204.6D is a sectional view taken through line 204.6D-204.6D in FIG. 204.6A.

FIG. 204.6E is a sectional view taken through line 204.6E-204.6E in FIG. 204.6A.

FIG. 206.1A is a view of the FIG. 206A substrate at a processing step subsequent to that shown by FIG. 206A.

FIG. 206.1C is a sectional view taken through line 206.1C-206.1C in FIG. 206.1A.

FIG. 206.1D is a sectional view taken through line 206.1D-206.1D in FIG. 206.1A.

FIG. 206.1E is a sectional view taken through line 206.1E-206.1E in FIG. 206.1A.

FIG. 207D is a sectional view taken through line 207D-207D in FIG. 207A.

FIG. 207E is a sectional view taken through line 207E-207E in FIG. 207A.

FIG. 207.1 is an enlarged sectional view of a portion of the FIG. 207D substrate taken through line 207.1-207.1 in FIG. 207D.

FIG. 306.1A is a diagrammatic top view of a semiconductor substrate in process in accordance with an embodiment of the invention.

FIG. 306.1B is a sectional view taken through line 306.1B-306.1B in FIG. 306.1A.

FIG. 306.1C is a sectional view taken through line 306.1C-306.1C in FIG. 306.1A.

FIG. 306.1D is a sectional view taken through line 306.1D-306.1D in FIG. 306.1A.

DETAILED DESCRIPTION OF EXAMPLE EMBODIMENTS

Figure 1A:
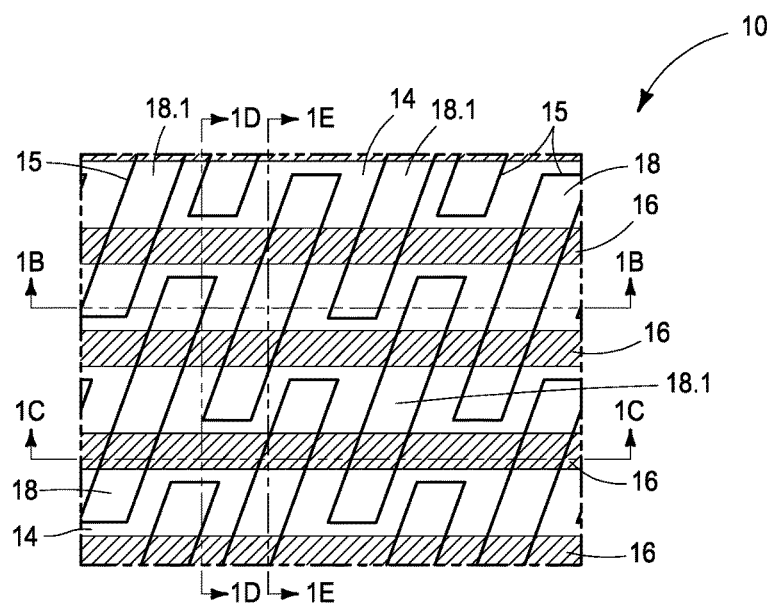
FIG. 1A is a diagrammatic top view of a semiconductor substrate in process in accordance with an embodiment of the invention.
Figure 1B:
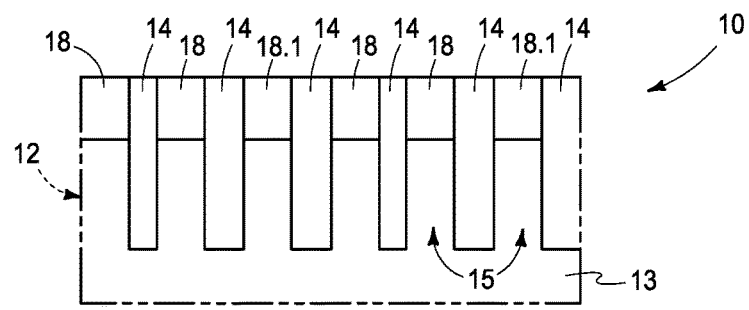
FIG. 1B is a sectional view taken through line B-B in FIG. 1A.

Embodiments of the invention encompass methods of forming an elevationally extending conductor laterally between a pair of conductive lines. In this document, "elevationally extending" refers to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document unless otherwise stated, "elevational(ly)", "higher", "upper", "lower", "top", "atop", "bottom", "above, "below", "under", and "beneath" are generally with reference to the vertical direction.

In one embodiment, memory circuitry may be formed, for example dynamic random access memory (DRAM). In one such embodiment, the conductive lines of the pair are digit lines and the elevationally extending conductor interconnects a transistor active area and a capacitor storage node of a capacitor of a memory cell. First example such embodiments are described with reference to FIGS. 1A-14E. With respect to all figures herein, the figures designated with "A" suffixes are diagrammatic top plan views of a portion of a semiconductor substrate in the process of manufacture. With respect to all figures herein, the figures with suffixes "B", "C", "D", and "E" are sectional views taken relative to their correspondingly numbered top plan "A" views as shown. Although the discussion proceeds largely with respect to fabrication of DRAM circuitry, the invention encompasses methods of forming any elevationally extending conductor laterally between any pair of conductive lines, including for any memory circuitry and/or non-memory circuitry.

Referring to FIGS. 1A-1E, a portion of an example starting substrate 10 is shown, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Materials may be aside, elevationally inward, or elevationally outward of the FIGS. 1A-1E-depicted materials. For example, other partially or wholly fabricated components of integrated circuitry may be provided somewhere above, about, or within substrate 10. Substrate 10 may comprise any one or more of conductive/conductor/conducting (i.e., electrically herein), semiconductive, or insulative/insulator/insulating (i.e., electrically herein) material(s). Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Figure 1C:
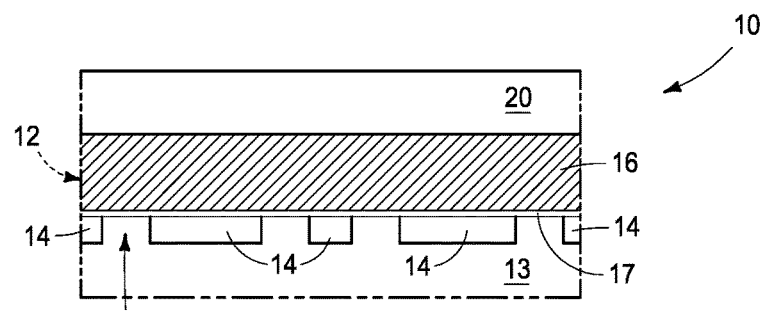
FIG. 1C is a sectional view taken through line C-C in FIG. 1A.
Figure 1D:
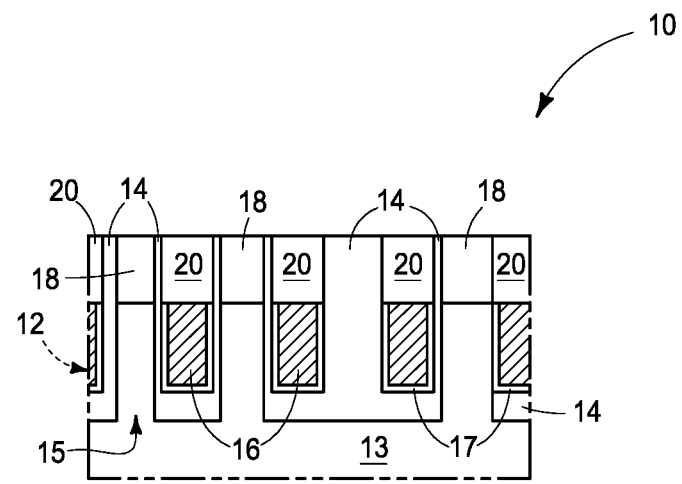
FIG. 1D is a sectional view taken through line D-D in FIG. 1A.
Figure 1E:
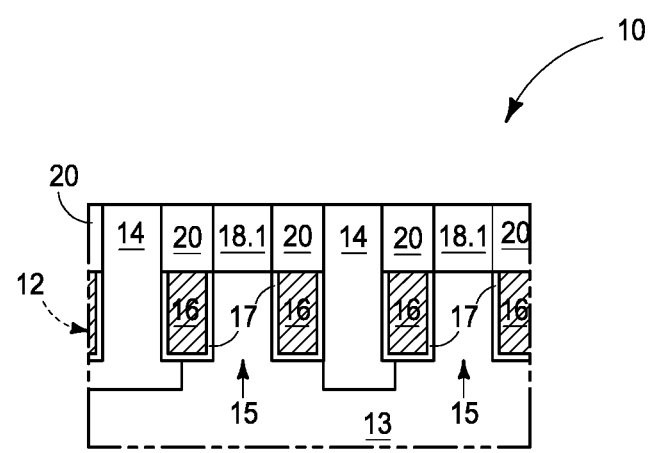
FIG. 1E is a sectional view taken through line E-E in FIG. 1A.

Substrate 10 comprises a base substrate 12 comprising semiconductor material 13 (e.g., suitably doped monocrystalline silicon) within which trench isolation regions 14 (e.g., silicon dioxide and/or silicon nitride) have been formed. Substrate 10 perhaps as best viewed in FIG. 1A may be considered as having longitudinally-elongated active area islands 15 of semiconductor material 13 surrounded by or within a sea of interconnected trench isolation regions 14. A series of recessed access gate lines 16 having gate insulator 17 (e.g., silicon dioxide) peripherally there-about is shown extending horizontally within semiconductor material 13 and trench isolation regions 14. Any suitable conductive material(s) may be used for access gate lines 16, with elemental metal, an alloy or mixture of two or more elemental metals, conductive metal compounds, and conductively doped semiconductive materials being examples. Access gate lines 16 may be formed using any suitable existing or yet-to-be-developed technique, and with or without pitch multiplication. Access gate lines 16 are capped with dielectric material 20 (e.g., silicon dioxide and/or silicon nitride). Gate lines 16 are shown with hatching in FIG. 1A for clarity, although as shown in FIGS. 1C-1E the conductive material of gate lines 16 is buried within base substrate 12 and trench isolation regions 14, and is beneath dielectric material 20.

Elevationally outermost portions of semiconductor material 13 have been suitably conductively doped with conductivity enhancing impurity(ies) to be electrically conductive (e.g., peak p-type or n-type doping of at least $1 \times 10^{20}$ atoms/cm$^3$) to form three transistor source/drain regions 18/18.1/18 within individual active area islands 15. In the example embodiment, the longitudinally outer source/drain regions 18 in each island 15 will electrically couple (in one embodiment directly electrically couple) with a storage node of a capacitor of an individual memory cell. The central source/drain region 18.1 will electrically couple (in one embodiment directly electrically couple) with a bit/digit line passing elevationally there-over. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. When suitable voltage is applied to an access line 16, a conductive channel forms within semiconductor material 13 proximate gate insulator 17 such that current is capable of flowing between a longitudinally outer source/drain region 18 and the central source/drain region 18.1 under an access line 16 within an individual active area island 15. Thus, in the example embodiment, each island 15 comprises two field effect transistors with each sharing the central source/drain region 18.1.

Figure 2A:
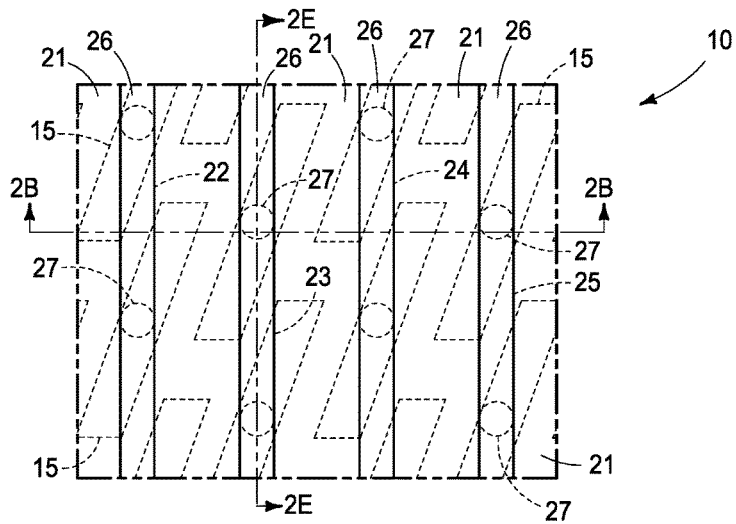
FIG. 2A is a view of the FIG. 1A substrate at a processing step subsequent to that shown by FIG. 1A.
Figure 2B:
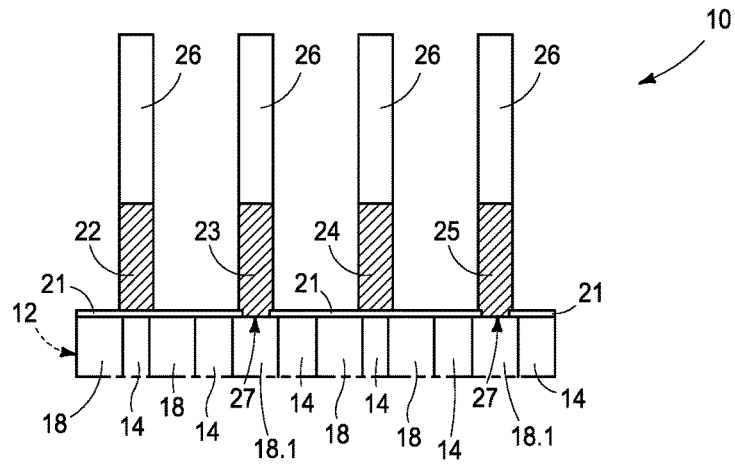
FIG. 2B is a sectional view taken through line 2B-2B in FIG. 2A.
Figure 2E:
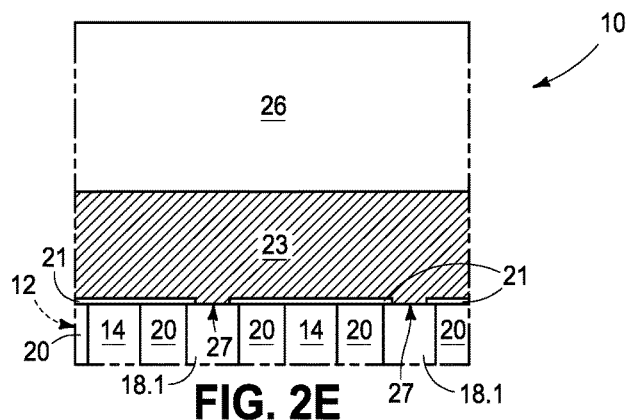
FIG. 2E is a sectional view taken through line 2E-2E in FIG. 2A.

Referring to FIGS. 2A/B/E, dielectric material 21 (e.g., silicon dioxide and/or silicon nitride) has been deposited and patterned to form digit line contact openings 27 therethrough over source/drain regions 18.1 and leave source/drain regions 18 covered with dielectric material 21. Then, conductive lines 22, 23, 24, and 25 have been formed over dielectric material 21, with each being spaced from one another in at least one vertical cross-section (e.g., the vertical cross-section shown by and as FIG. 2B). As with access gate lines 16, any suitable conductive material may be used for lines 22-25 and such may be formed using any suitable technique. In one embodiment, conductive lines 22-25 are formed to extend horizontally. Conductive lines 22-25 are shown as having dielectric/insulator caps 26 (e.g., silicon nitride and/or silicon dioxide) formed there-over. The different materials that are lower than the conductive materials of lines 22-25 as shown in FIG. 2B are not shown in FIG. 2A for clarity in FIG. 2A, and in most subsequent "A" figures. The discussion largely proceeds with respect to forming an elevationally extending conductor (not shown in FIGS. 2A, 2B, and 2E) between a pair of conductive lines 23, 24. However, it will be apparent in the example embodiment that elevationally extending conductors are also formed between other immediate adjacent pairs of conductive lines and additional such conductors are also formed between conductive lines 23 and 24.

Figure 3A:
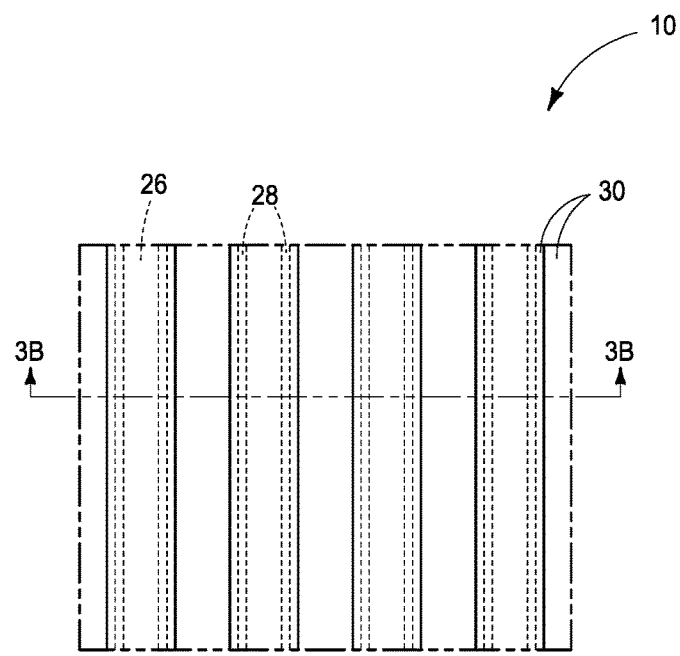
FIG. 3A is a view of the FIG. 2A substrate at a processing step subsequent to that shown by FIG. 2A.
Figure 3B:
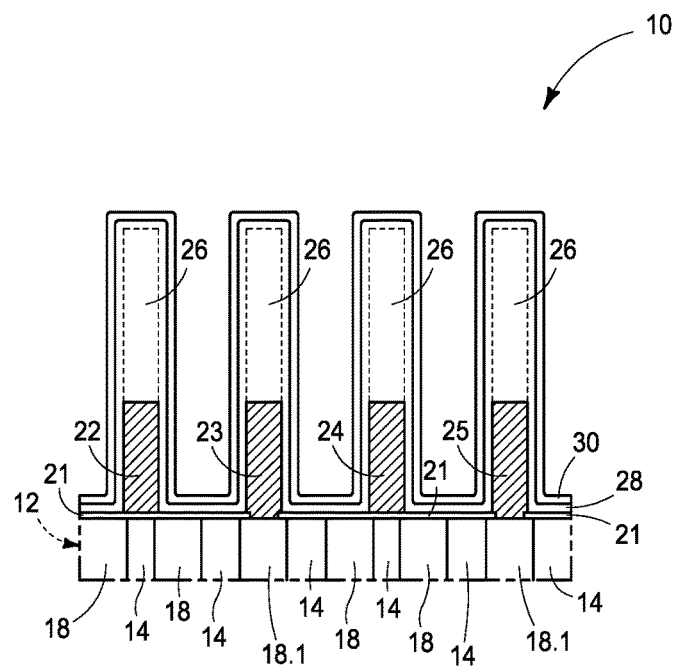
FIG. 3B is a sectional view taken through line 3B-3B in FIG. 3A.

Referring to FIGS. 3A/B and in one embodiment, dielectric material 28 and sacrificial material 30 have been formed over sidewalls of the pair of conductive lines 23, 24 in the depicted vertical cross-section. In one embodiment and as shown, dielectric material 28 is of the same composition as that of dielectric material 26 as is exemplified by the dashed-line interface between materials 26 and 28. Sacrificial material 30 may be entirely removed from the substrate in subsequent processing and accordingly if so may comprise any of semiconductive, conductive, and/or dielectric material. Ideally, sacrificial material 30 is of different composition from that of material 28, with silicon nitride and silicon dioxide being one example for materials 28 and 30, respectively. Another material (not shown) may be put over sacrificial material 30, for example another non-sacrificial dielectric material that is of the same or different composition as that of dielectric material 26 and/or 28. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", "adjacent", "along", and "against" not preceded by "directly" encompass "directly against" as well as construction where intervening material(s) or structure(s) result(s) in no physical touching contact of the stated materials or structures relative one another.

Example thicknesses for materials 28 and 30 are 30 Angstroms and 50 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable.

Figure 4A:
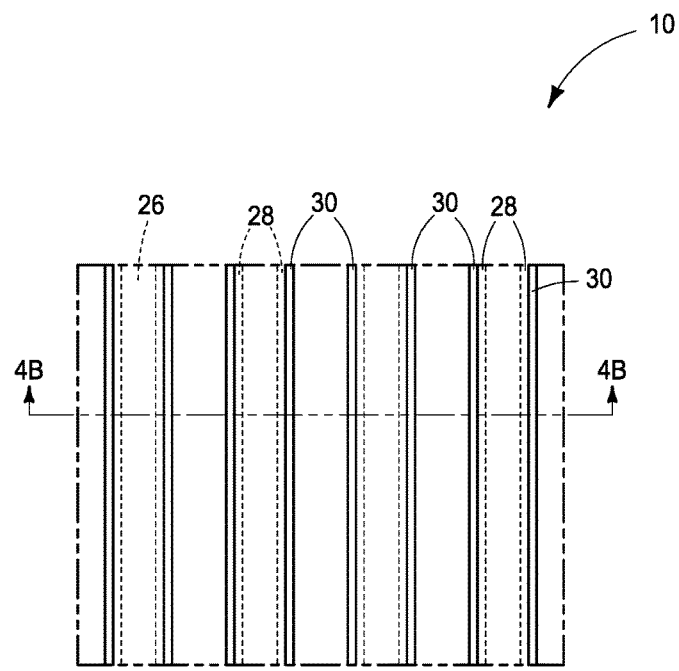
FIG. 4A is a view of the FIG. 3A substrate at a processing step subsequent to that shown by FIG. 3A.

Referring to FIGS. 4A/B, materials 21, 28, and 30 have been subjected to a suitable anisotropic etch to substantially remove such materials from being over horizontal surfaces, thus re-exposing source/drain regions 18.

Figure 5A:
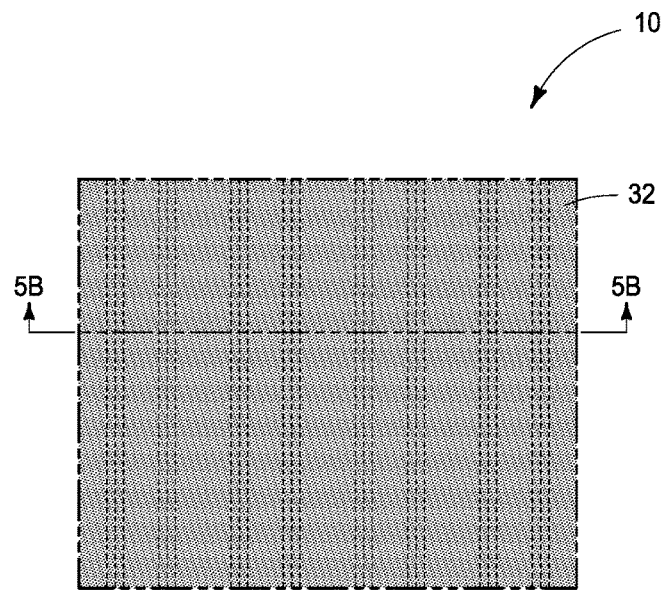
FIG. 5A is a view of the FIG. 4A substrate at a processing step subsequent to that shown by FIG. 4A.
Figure 5B:
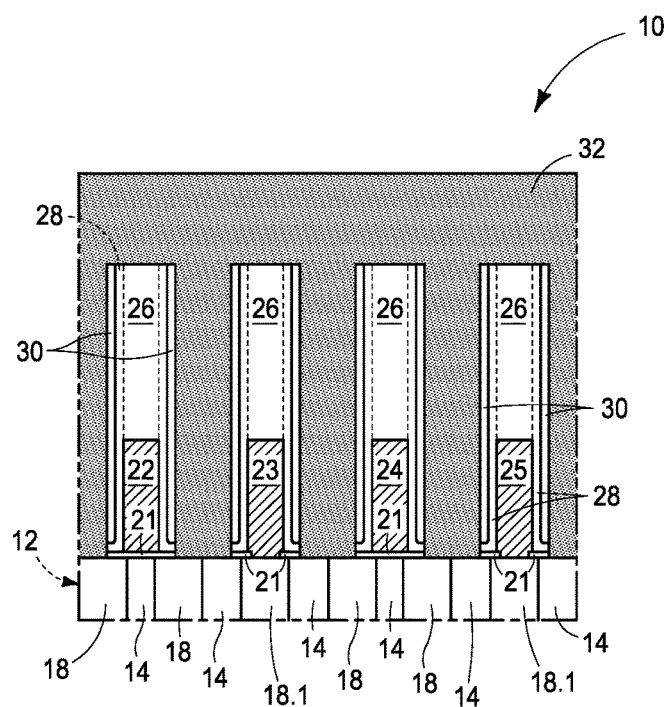
FIG. 5B is a sectional view taken through line 5B-5B in FIG. 5A.

Referring to FIGS. 5A/B, conductor material 32 has been formed over substrate 12 to elevationally extend laterally between the pair of conductive lines 23, 24 and laterally over (e.g., elevationally along) sacrificial material 30 and to cross elevationally over the pair of conductive lines 23, 24 in the depicted vertical cross-section. An example elevational thickness for conductor material 32 above materials 26, 28, and 30 is 500 Angstroms. Any suitable conductor material may be used, with one ideal example being conductively doped semiconductive material (e.g., conductively doped poly silicon). The elevationally extending conductor material 32 extends to directly electrically couple (in one embodiment) to a node location (e.g., one of source/drain regions 18) that is laterally between the pair of conductive lines 23, 24 in the depicted vertical cross-section.

Figure 6A:
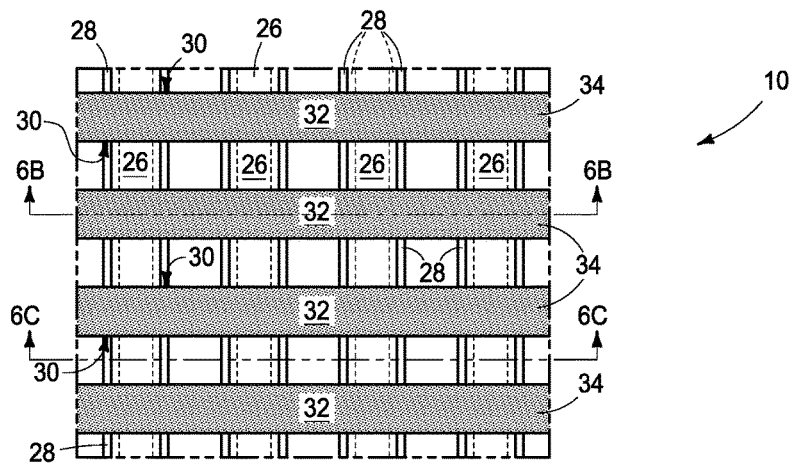
FIG. 6A is a view of the FIG. 5A substrate at a processing step subsequent to that shown by FIG. 5A.
Figure 6B:
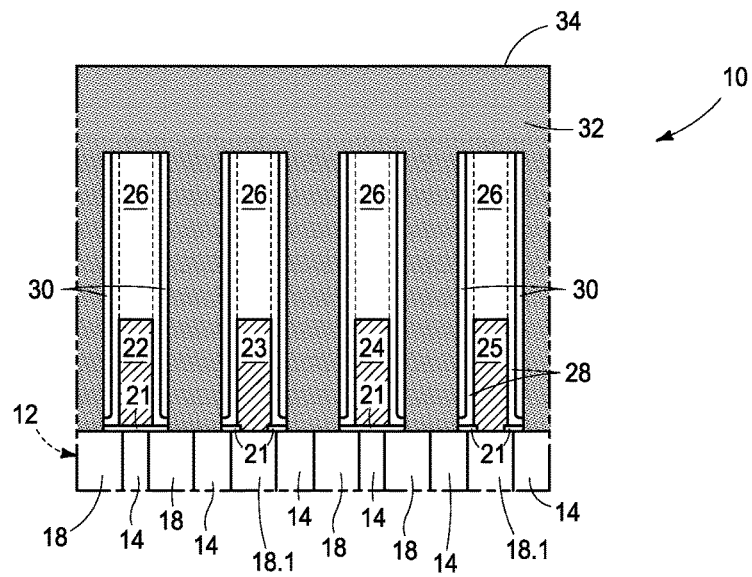
FIG. 6B is a sectional view taken through line 6B-6B in FIG. 6A.
Figure 6C:
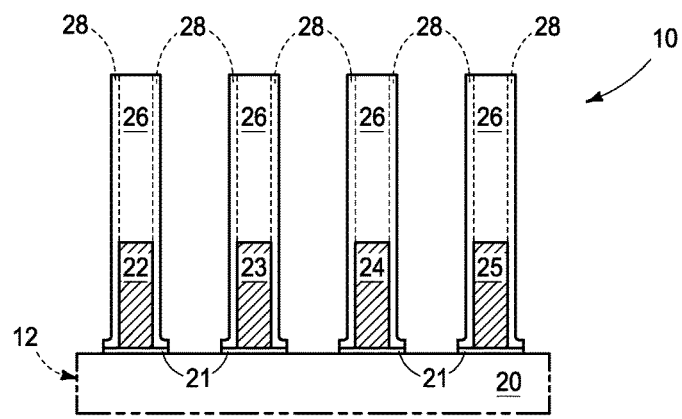
FIG. 6C is a sectional view taken through line 6C-6C in FIG. 6A.

Referring to FIGS. 6A-C, and in one embodiment, conductor material 32 has been subtractively patterned to form a conductor material line 34 (four such lines 34 being shown) that has conductor material 32 extending elevationally to node location 18 between the pair of conductive lines 23, 24, with conductor material line 34 crossing elevationally over conductive lines 23, 24. Any suitable subtractive patterning technique may be used, (e.g., photolithographic patterning and etch) and with or without pitch multiplication. Regardless and as shown, formation of lines 34 may expose elevationally extending transverse ends/edges of sacrificial material 30 (FIG. 6A).

The above described processing is but one example technique of forming conductor material (e.g., 32) elevationally extending laterally between and crossing over a pair of conductive lines (e.g., 23, 24) in at least one vertical cross-section (i.e., regardless of whether the conductor material 32 is formed into the outline of a longitudinally extending line). Sacrificial material (e.g., 30) is laterally between the elevationally extending conductor material and each of the conductive lines of the pair in the vertical cross-section (i.e., regardless of when the sacrificial material is formed). In one embodiment and as shown, the conductor material is formed to comprise a horizontally extending conductor material line (e.g., 34) that crosses elevationally over the pair of conductive lines and has conductor material thereof extending elevationally inward laterally between the pair of conductive lines.

Figure 7A:
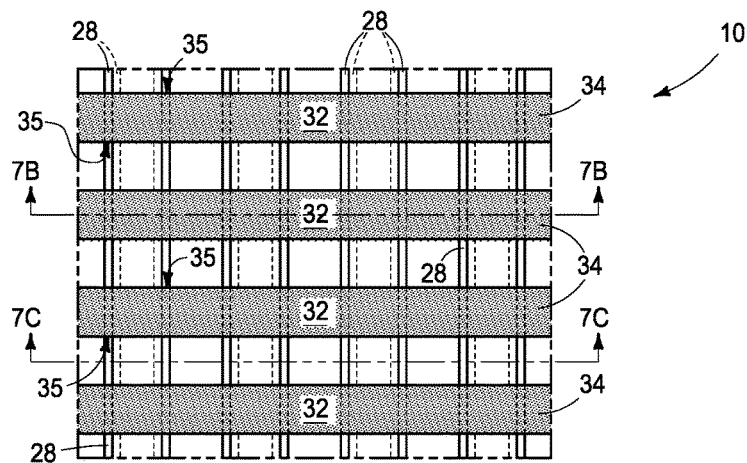
FIG. 7A is a view of the FIG. 6A substrate at a processing step subsequent to that shown by FIG. 6A.
Figure 7B:
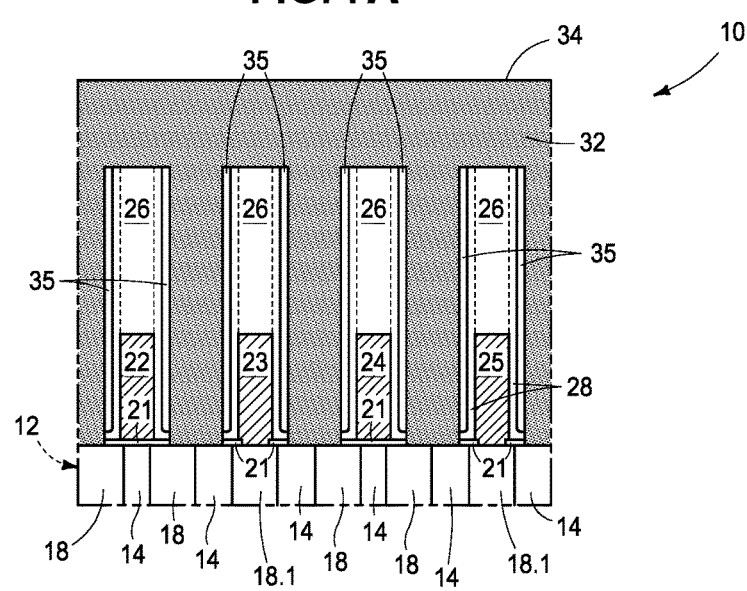
FIG. 7B is a sectional view taken through line 7B-7B in FIG. 7A.
Figure 7C:
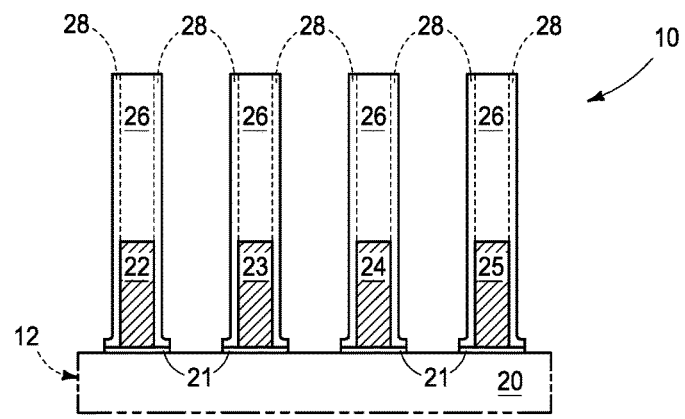
FIG. 7C is a sectional view taken through line 7C-7C in FIG. 7A.
Figure 9A:
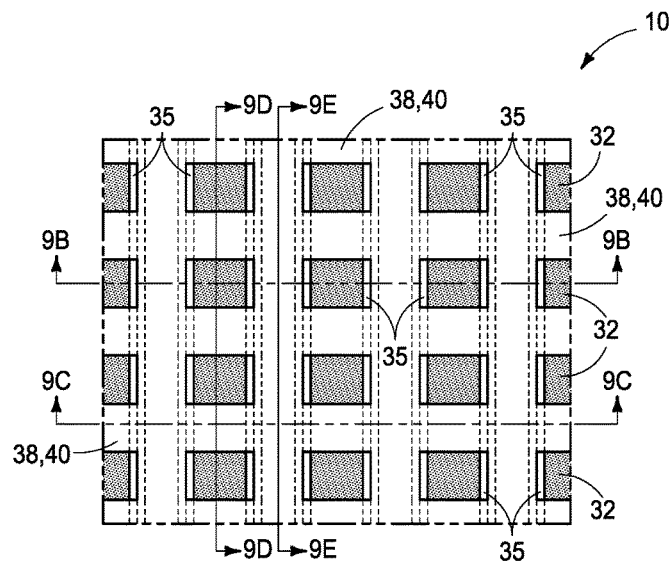
FIG. 9A is a view of the FIG. 8A substrate at a processing step subsequent to that shown by FIG. 8A.
Figure 9B:
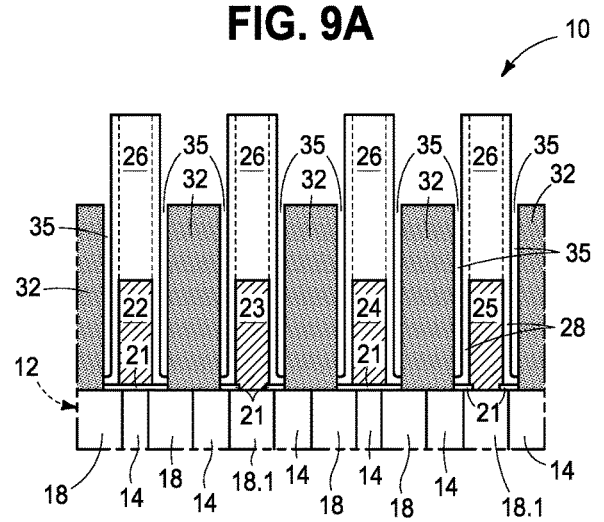
FIG. 9B is a sectional view taken through line 9B-9B in FIG. 9A.
Figure 9C:
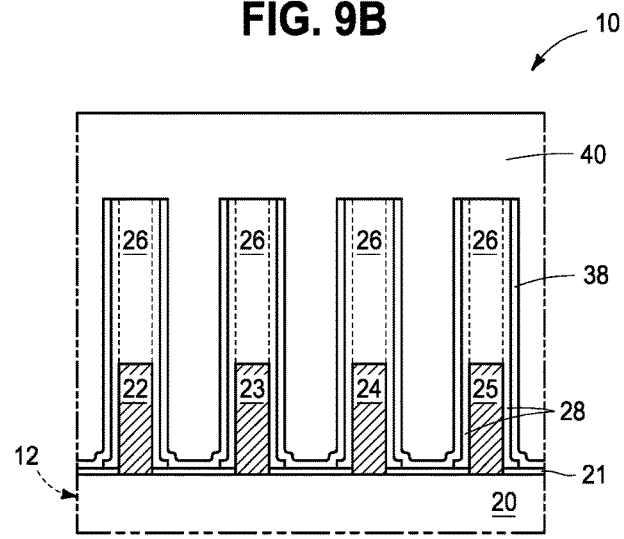
FIG. 9C is a sectional view taken through line 9C-9C in FIG. 9A.
Figure 9D:
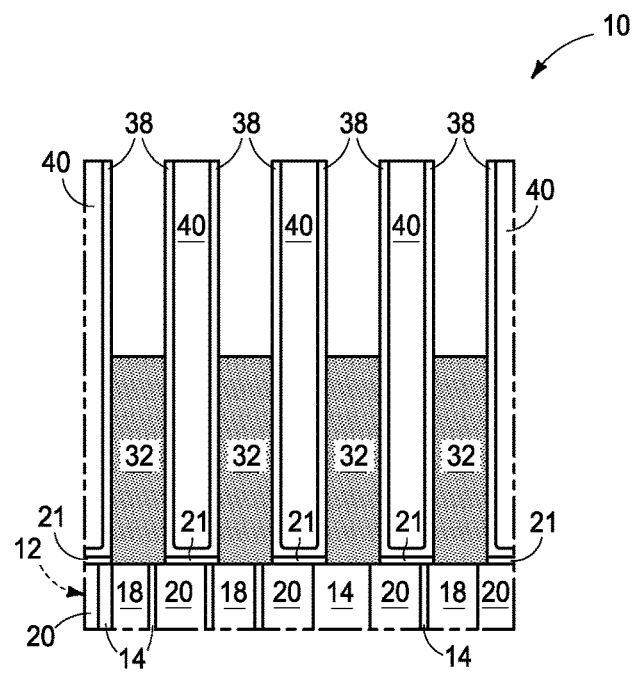
FIG. 9D is a sectional view taken through line 9D-9D in FIG. 9A.
Figure 9E:
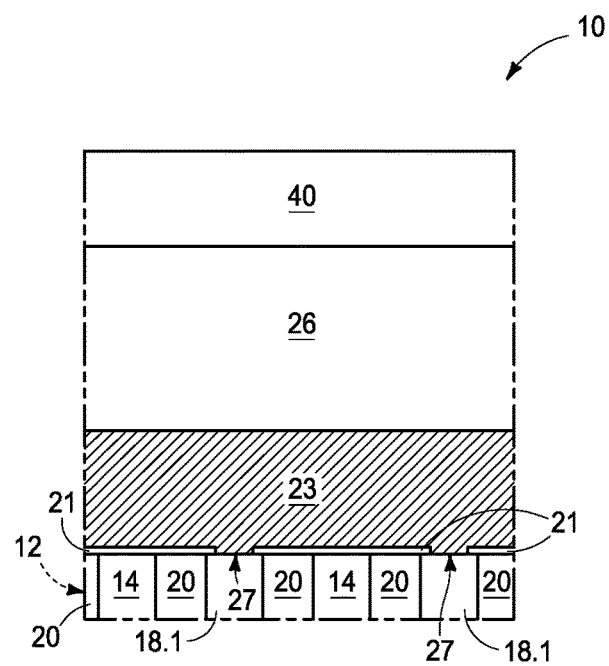
FIG. 9E is a sectional view taken through line 9E-9E in FIG. 9A.
Figure 10A:
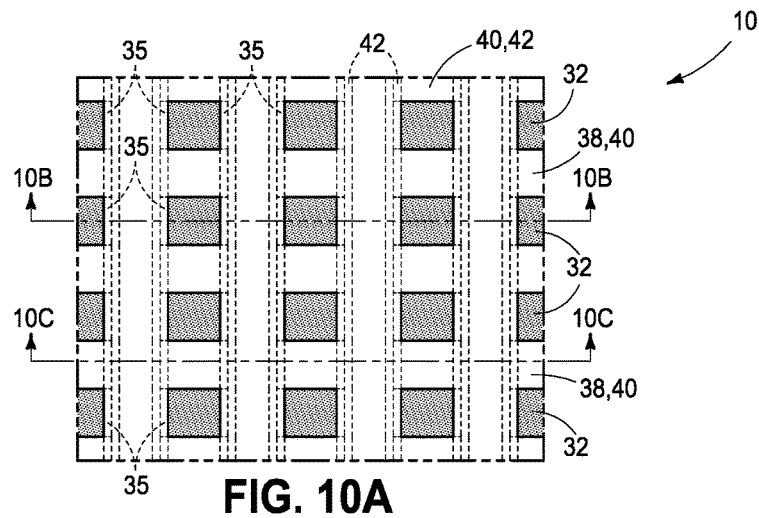
FIG. 10A is a view of the FIG. 9A substrate at a processing step subsequent to that shown by FIG. 9A.
Figure 10B:
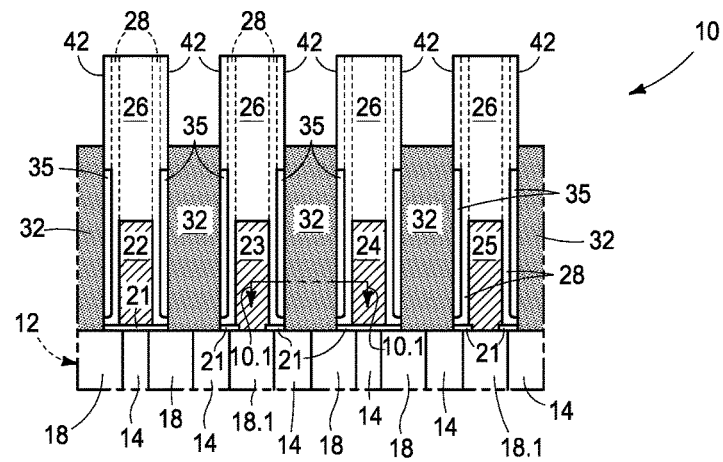
FIG. 10B is a sectional view taken through line 10B-10B in FIG. 10A.
Figure 10C:
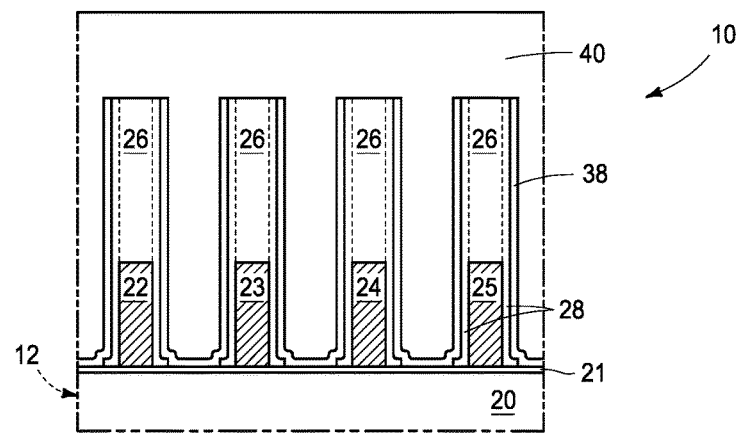
FIG. 10C is a sectional view taken through line 10C-10C in FIG. 10A.

Referring to FIGS. 7A-C, sacrificial material 30 (not shown) has been removed from between the conductor material 32 that extends elevationally to node location 18 and each of conductive lines 23, 24 while conductor material line 34 is crossing elevationally over conductive lines 23, 24. This forms a void space 35 laterally between the conductor material 32 that is extending elevationally to node location 18 and each of conductive lines 23, 24 in the depicted vertical cross-section. Such removing of the sacrificial material may occur by any suitable technique, for example wet isotropic etching of sacrificial material 30 (not shown) selectively relative to other exposed materials. In this document, a selective etch or removal is an etch or removal where one material is removed relative to another stated material or materials at a rate of at least 2.0:1. As shown, individual void spaces 35 are elevationally covered by conductor material 32 and open along their respective transverse opposing elevational ends/edges (FIG. 7A). An example wet isotropic etching chemistry for etching silicon dioxide (e.g., sacrificial material 30) selectively relative to polysilicon (e.g., conductor material 32) and silicon nitride (e.g., materials 26 and 28) is dilute aqueous HF (100:1 by volume $H_2O$ to HF).

The above describe processing is but one example technique of removing the sacrificial material from between the elevationally extending conductor material and each of the conductive lines of the pair while the conductor material is crossing elevationally over the pair of conductive lines (i.e., regardless of whether the conductor material is in the form of a longitudinally extending line) to form a void space laterally between the elevationally extending conductor material and each of the conductive lines of the pair in the at least one vertical cross-section.

Dielectric material is formed laterally over (e.g., elevationally along) opposing sidewalls of the elevationally extending conductor material to seal void spaces 35 without completely filling them (if filling them at all). As an example, FIGS. 8A-D show formation of a dielectric liner 38 (e.g., silicon dioxide and/or silicon nitride) and dielectric material 40 (e.g., silicon nitride and/or silicon dioxide) laterally over opposing sidewalls of the elevationally extending conductor material. In one embodiment and as shown, dielectric material 38/40 fills the remaining space that is transversally between conductor material lines 34, and in one embodiment the remaining space that is laterally between conductive lines 23, 24. Materials 38 and 40 are shown as a combined/single material in FIG. 8A for clarity in FIG. 8A. An example technique is to deposit materials 38, 40 to overfill such spaces, followed by planarizing materials 38, 40 back at least to the elevationally outermost surfaces of conductor material 32 of lines 34. Dielectric liner 38 as a thin layer might be deposited before dielectric material 40 to facilitate sealing and retaining void spaces 35 than might otherwise occur if depositing dielectric material 40 alone. For example if material 40 is deposited initially as a spin-on liquid dielectric, such may undesirably fill all or significant portions of void spaces 35.

Referring to FIGS. 9A-E, conductor material 32 has been removed from crossing elevationally over the pair of conductive lines 23, 24 while leaving at least some of conductor material 32 extending elevationally to node location 18. An example technique for doing so is a timed dry etch of conductor material 32 selectively relative to other exposed material. Such may have the effect of re-exposing (unsealing) void spaces 35, for example as shown. The example elevationally crossing conductor material as shown in the processing with respect FIGS. 7A and 7B may facilitate keeping the conductor material that is elevationally extending between the pair of conductive lines from leaning or toppling prior to removal of the elevationally crossing conductor material. An example dry etch for etching polysilicon (e.g., conductor material 32) selectively relative to silicon nitride (e.g., materials 26 and 28) and silicon dioxide is $SF_6$ at 20 sccm, Ar at 150 sccm, 10 mTorr pressure, 600 W transformer coupled plasma (TCP) power, and 0 W bias.

Referring to FIGS. 10A-C and 10.1, re-opened void spaces 35 have been re-sealed, for example by deposition of a dielectric material 42 (e.g., 35 Angstroms of silicon nitride and/or silicon dioxide) followed by anisotropic etch thereof to substantially remove material 42 from being over horizontal surfaces. An example dielectric material 42 is of the same composition as material 28 as shown by the dashed line interface between materials 42 and 28. Void spaces 35 may ultimately be sealed (e.g., FIGS. 10B and 10.1) while exposed to room ambient, thereby forming void spaces 35 as air spaces or air gaps. Alternately, such may be ultimately sealed in a vacuum or in an ambient comprising a gas other than air, for example an inert gas such as nitrogen or argon.

Figure 11A:
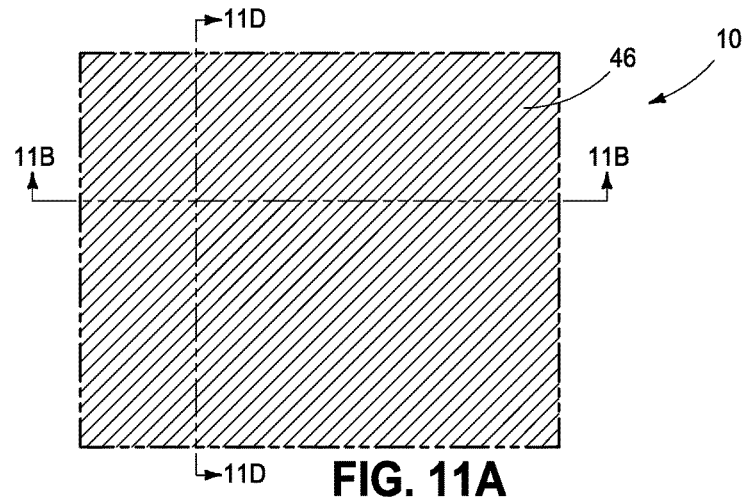
FIG. 11A is a view of the FIG. 10A substrate at a processing step subsequent to that shown by FIG. 10A.
Figure 11B:
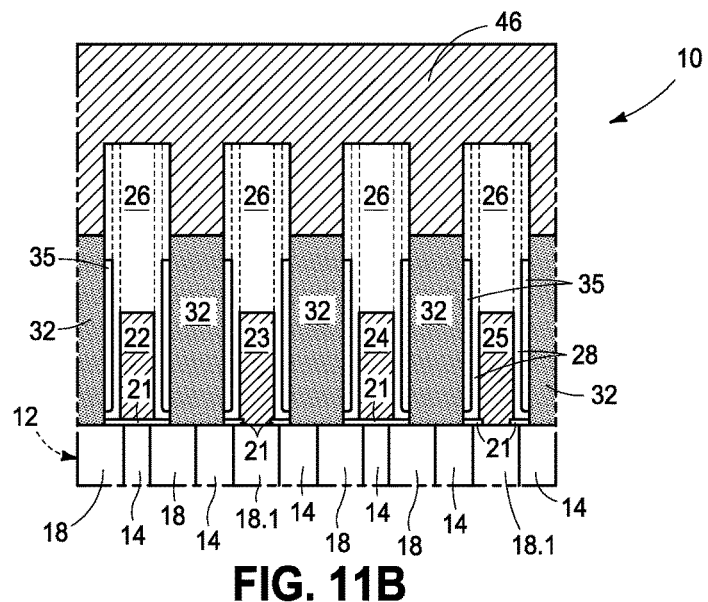
FIG. 11B is a sectional view taken through line 11B-11B in FIG. 11A.
Figure 11D:
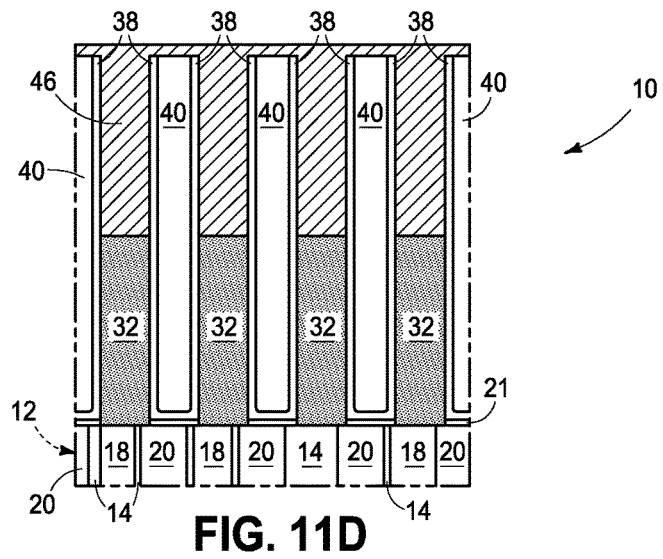
FIG. 11D is a sectional view taken through line 11D-11D in FIG. 11A.

Referring to FIGS. 11A/B/D, conductive material 46 (e.g., elemental metal, a mixture or alloy of two or more elemental metals, and/or a conductive metal compound) has been deposited over the substrate, and in one embodiment directly against conductor material 32. A metal silicide (not shown) may form between materials 32 and 46 where one is silicon and the other is metal.

Figure 12A:
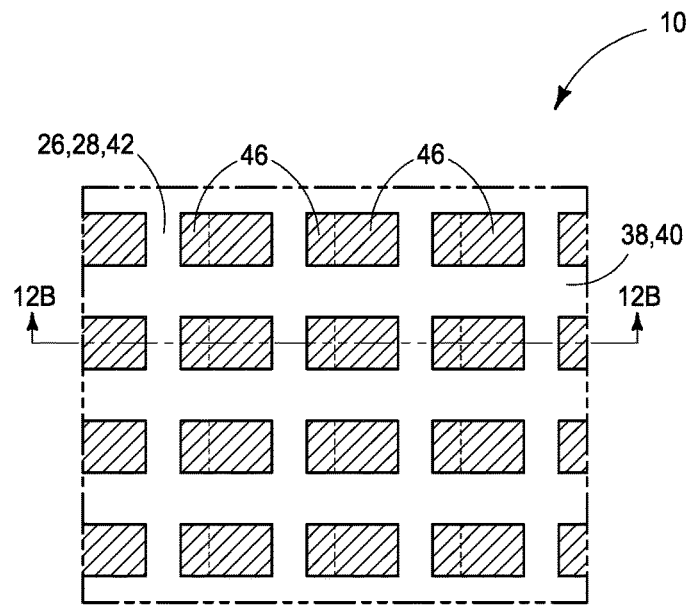
FIG. 12A is a view of the FIG. 11A substrate at a processing step subsequent to that shown by FIG. 11A.
Figure 12B:
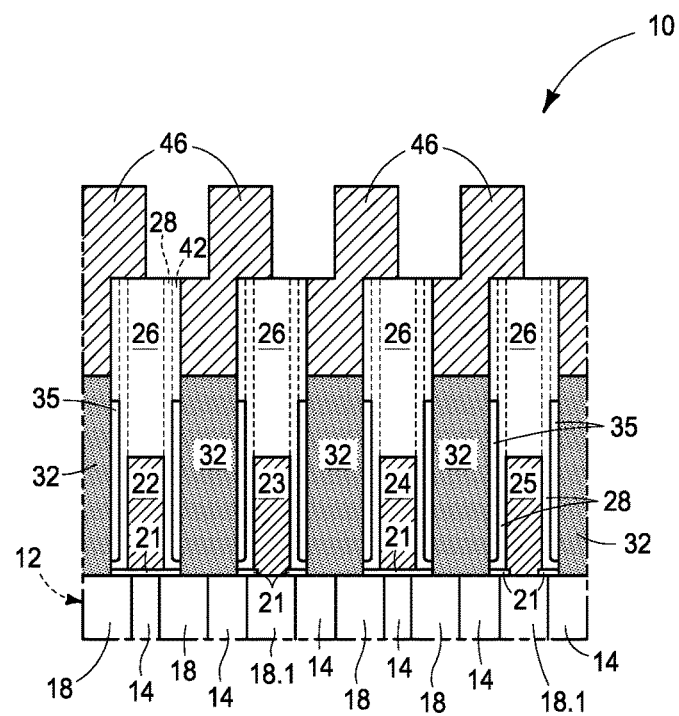
FIG. 12B is a sectional view taken through line 12B-12B in FIG. 12A.

Referring to FIGS. 12A/B, conductive material 46 has been patterned (e.g., by lithography and subtractive etch) at least back to elevationally outermost surfaces of materials 26, 28, and 42 as shown.

Figure 13A:
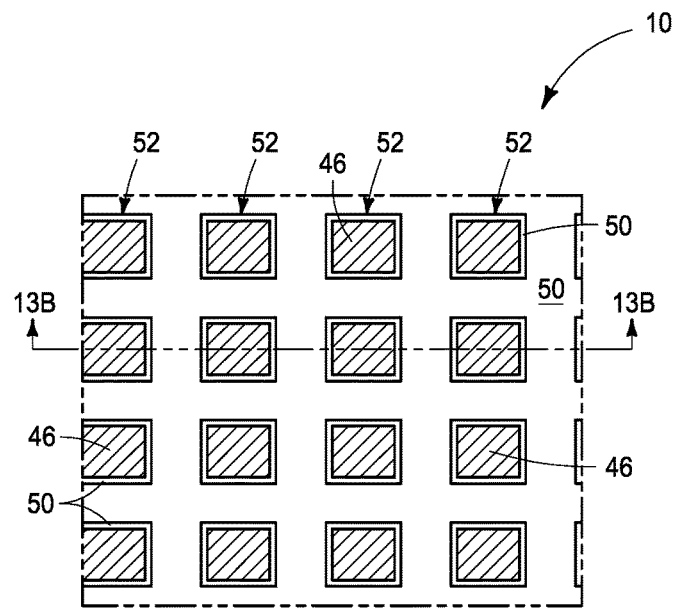
FIG. 13A is a view of the FIG. 12A substrate at a processing step subsequent to that shown by FIG. 12A.
Figure 13B:
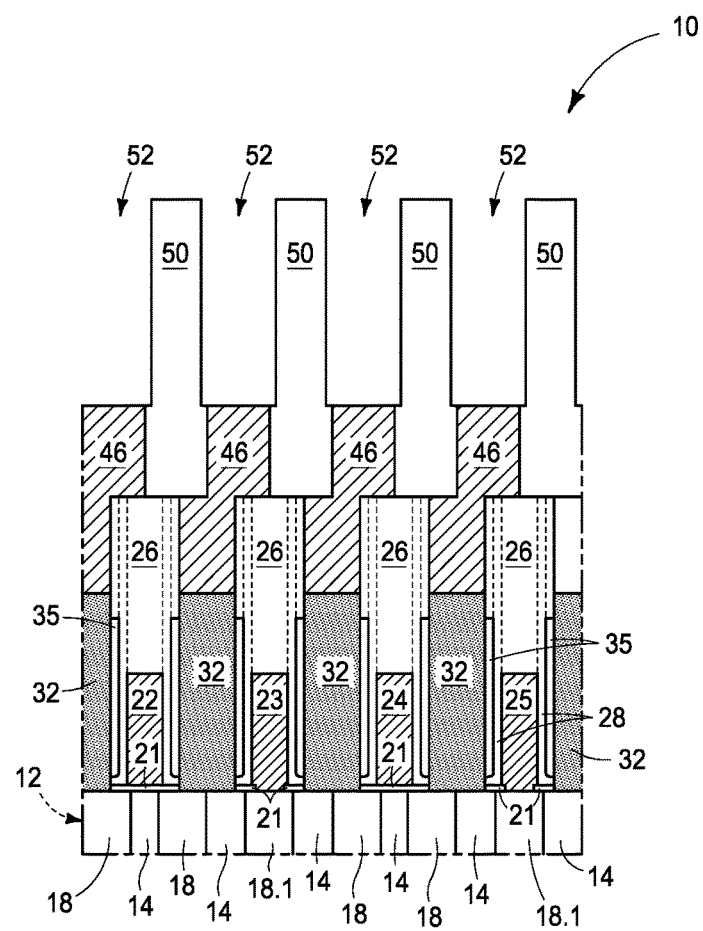
FIG. 13B is a sectional view taken through line 13B-13B in FIG. 13A.

Referring to FIGS. 13A/B, dielectric material 50 (e.g., silicon dioxide and/or silicon nitride) has been deposited and openings 52 formed there-through over and to expose elevationally outermost surfaces of conductive material 46.

Figure 14A:
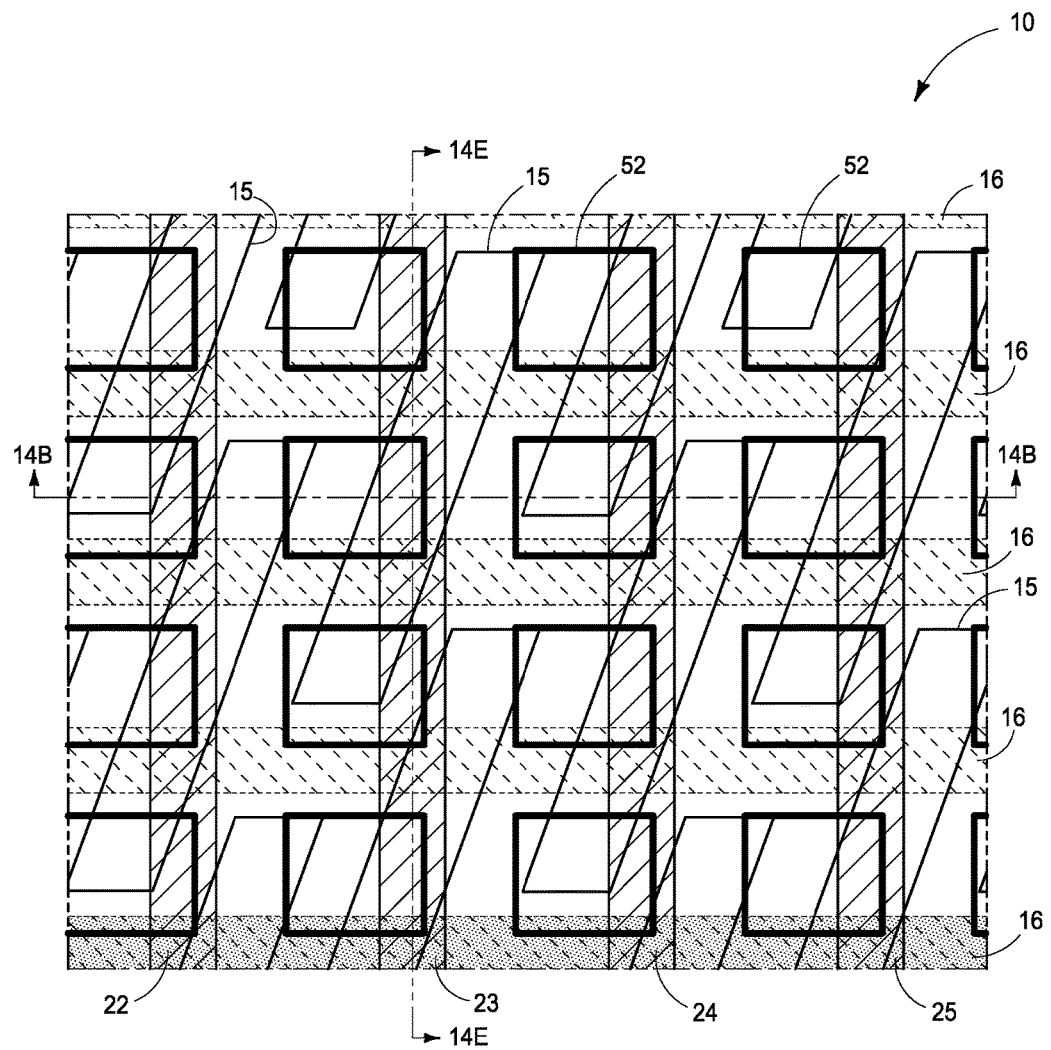
FIG. 14A is an enlarged view of the FIG. 13A substrate at a processing step subsequent to that shown by FIG. 13A.
Figure 14B:
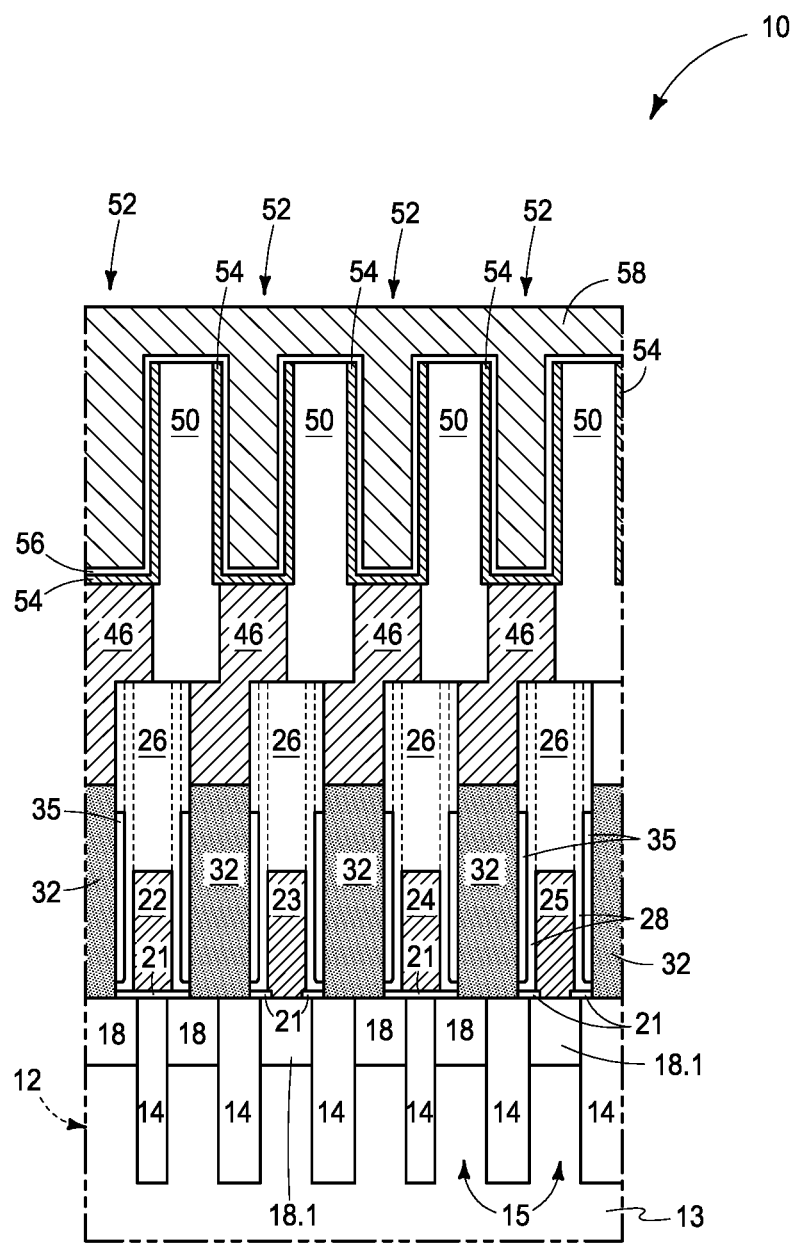
FIG. 14B is a normal-scale sectional view taken through line 14B-14B in FIG. 14A.
Figure 14E:
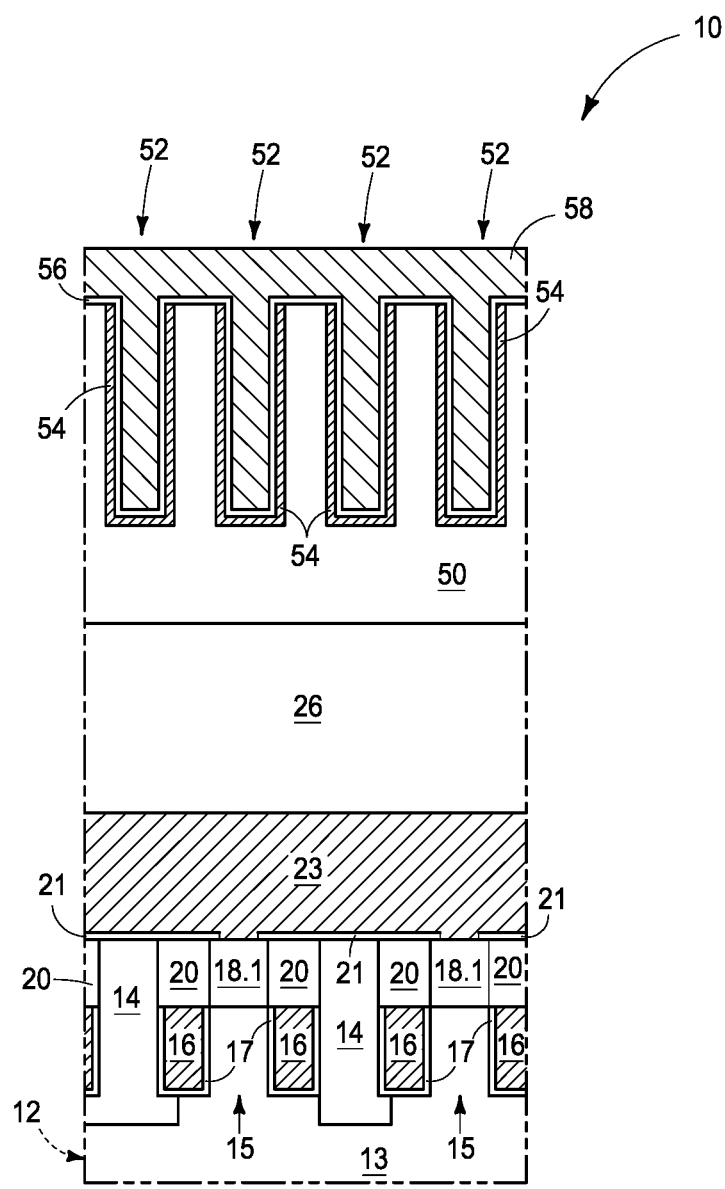
FIG. 14E is a normal-scale sectional view taken through line 14E-14E in FIG. 14A.

Referring to FIGS. 14A/B/E, conductive storage node material 54 has been deposited to line openings 52, and then has been planarized back at least to the elevationally outermost surfaces of dielectric material 50. Capacitor dielectric 56 and conductive cell capacitor material 58 have then been deposited, thus forming example conventional DRAM cells of a DRAM array in accordance with but one example-described embodiment. Materials 54, 56, and 58 are not shown in FIG. 14A for clarity in FIG. 14A.

Another example method of forming an elevationally extending conductor laterally between a pair of conductive lines is next described with references to FIGS. 104.1A-108D (using a series of numerals in the 100's to identify the Figures) with respect to an alternate embodiment substrate 10*a*. Like numerals from the above-described embodiments have been used where appropriate, with some construction differences being indicated with the suffix "a" or with different numerals. To assist the reader, common consecutive numerical sequences have been used in the figures and descriptions with respect to all embodiments after the first-described embodiments of FIGS. 1A-14E with respect to substrate 10. Specifically, a last Arabic numeral immediately-preceding a decimal point, if any, corresponds in processing sequence to the first-described embodiments. For example, a FIG. 106 and a FIG. 206 correspond to the same processing sequence shown by FIG. 6, and correspond to each other, as the last numeral in each before any decimal point is the numeral 6. Decimal points with Arabic numerals thereafter are used to designate alternate and sequential processing that does not correspond to processing shown in the first-described embodiments. For example, FIGS. 206.1, 206.2, 206.3, etc. sequentially occur after the processing depicted by FIG. 206 yet do not correspond to processing shown by FIG. 6 or thereafter before FIG. 7 in the first-described embodiments. Accordingly, FIGS. 104.1A and 104.1B show processing immediately subsequent to the processing shown by FIGS. 4A and 4B in the first-described embodiments. Accordingly, sacrificial material 30 has been formed over sidewalls of the pair of conductive lines 23, 24 and then materials 21, 28, and 30 have been etched to be substantially removed from horizontal surfaces. Alternately as explained with respect to additional embodiments below, sacrificial material 30 may be deposited yet not etched to be substantially removed from horizontal surfaces, or sacrificial material 30 may not be at all deposited at this point in some of the alternate embodiment processes. Regardless, FIGS. 104.1A and 104.1B show a first sacrificial material 62 having been formed over substrate 12. In one embodiment, sacrificial material 30 may be considered as second sacrificial material that has been formed over sidewalls of the pair of conductive lines 23, 24 in at least one vertical cross-section, and regardless of when such is formed. Reference to "first" and "second" with respect to different components or materials herein is only for convenience of description in referring to different components, different materials, and/or to same materials or components formed at different times. Accordingly and unless otherwise indicated, "first" and "second" may be interchanged independent of relative position within the finished circuit construction and independent of sequence in fabrication. First sacrificial material 62 may be inorganic, for example comprising one of silicon dioxide or silicon nitride. Alternately, such may be organic, for example comprising or consisting essentially of carbon with one or more inorganic antireflective materials. In one embodiment, first sacrificial material 62 is predominantly carbon (i.e. at least 75 atomic % carbon). One such example is a stack, from bottom-up, comprising an organic underlayer (900 Angstroms), elemental carbon (900 Angstroms), inorganic silicon-rich antireflective coating (150 Angstroms), organic underlayer (800 Angstroms), and inorganic antireflective coating (200 Angstroms).

Referring to FIGS. 104.2A-C, first sacrificial material 62 has been subtractively patterned to form a first sacrificial material line 63 (four lines 63 being shown) crossing the pair of conductive lines 23, 24 in the depicted vertical cross-section. First sacrificial material line 63 comprises first sacrificial material 62 extending elevationally laterally between the pair of conductive lines 23, 24. Lines 63 may be formed using any suitable technique with or without pitch multiplication. In one embodiment, line 63 has a longitudinal extent and position corresponding to that of the conductor material line to be formed. Sacrificial material 62 in one embodiment may also be considered as placeholder material used at least in part in the forming of such a conductor material line as will be apparent from the continuing discussion with respect to multiple different embodiments.

Referring to FIGS. 104.3A/C/D, dielectric material 64 (e.g., silicon nitride and/or silicon dioxide) has been formed over opposing sides of patterned sacrificial material line 63. One technique of doing so is to initially deposit material 64 atop and over sidewalls of patterned material 62 (e.g., lines 63), followed by removing dielectric material 64 elevationally inward to expose an elevationally outermost surface of patterned material 62 and leave dielectric material 64 laterally over the sidewalls of patterned material 62.

Referring to FIGS. 104.4A/B/D, patterned material 62 (e.g., lines 63, and neither of which are shown) has been removed to form trenches 66. An example technique for doing so is etching. An example selective etching chemistry where material 62 predominately comprises carbon and material 64 is silicon nitride or silicon dioxide is plasma $O_2$ or plasma $O_2/SO_2$.

Referring to FIGS. 106A-D, trenches 66 have been filled with conductor material 32. An example technique for doing so includes overfilling trenches 66 with conductor material 32 including forming conductor material 32 elevationally over (not shown) dielectric material 64. Thereafter, conductor material 32 may be removed from being elevationally over dielectric material 64 producing the example construction as shown. Such processing is but one example technique of replacing first sacrificial material line 63 (not shown) with conductor material 32 to form a conductor material line 34 crossing elevationally over the pair of conductive lines 23, 24, with conductor material line 34 having conductor material 32 extending elevationally to a node location laterally between the pair of conductive lines 23, 24 in the depicted vertical cross-section.

Referring to FIGS. 106.1A/C/D, and in one embodiment, dielectric material 64 has been etched elevationally inward selectively relative to conductor material lines 34, and ideally as shown to leave an elevationally outermost surface 67 of dielectric material 64 that is elevationally higher (e.g., by at least about 100 Angstroms) than that of such a surface 69 (FIG. 106.1C) of conductive material of the pair of conductive lines 23, 24. In one embodiment and as shown, materials 26 and 28 are of different composition from that of dielectric material 64, and the etch of material 64 is conducted selectively relative to materials 26 and 28. Alternately, dielectric materials 26 and 64 (and perhaps 28) may be of the same composition relative each other, with each being etched back ideally to leave the upper surface of dielectric material 26 at least about 100 Angstroms thick above conductive lines 23 and 24 to keep their upper surfaces covered by dielectric 26 (such alternate etching not being shown). Regardless, in one embodiment and as shown, second sacrificial material 30 is of different composition from that of dielectric material 64, and the illustrated etch of material 64 is conducted selectively relative to material 30. An example dry anisotropic etching chemistry for etching silicon nitride (e.g., dielectric material 64) selectively relative to polysilicon (e.g., conductor material 32) and silicon dioxide is plasma $CH_2F_2/O_2/Ar$, or plasma $CH_3F/O_2/Ar$. An example wet aqueous chemistry is 90% (by volume) $H_3PO_4$.

Figure 106A:
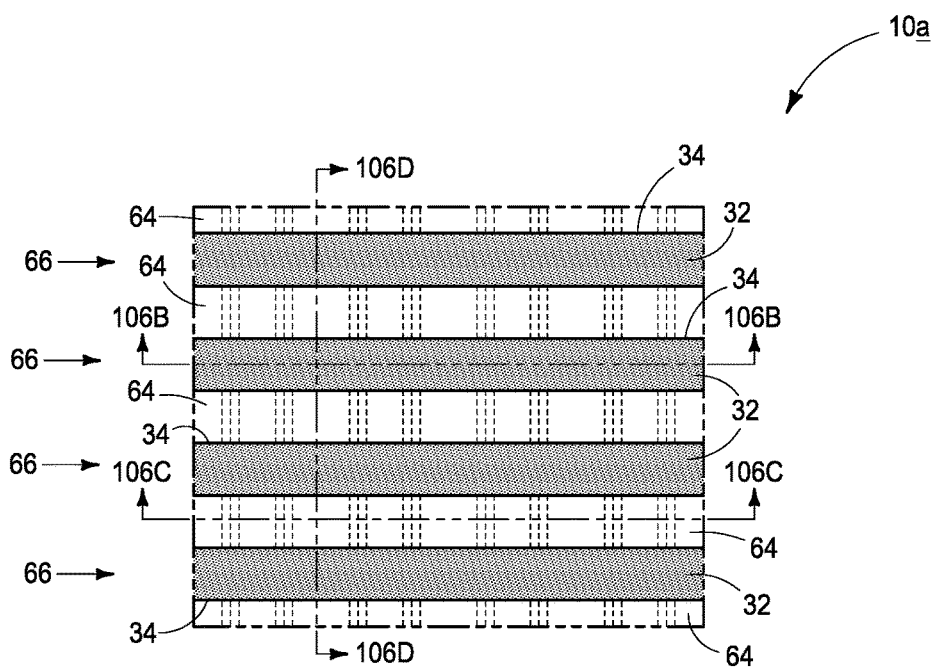
FIG. 106A is a view of the FIG. 104.4A substrate at a processing step subsequent to that shown by FIG. 104.4A.
Figure 106B:
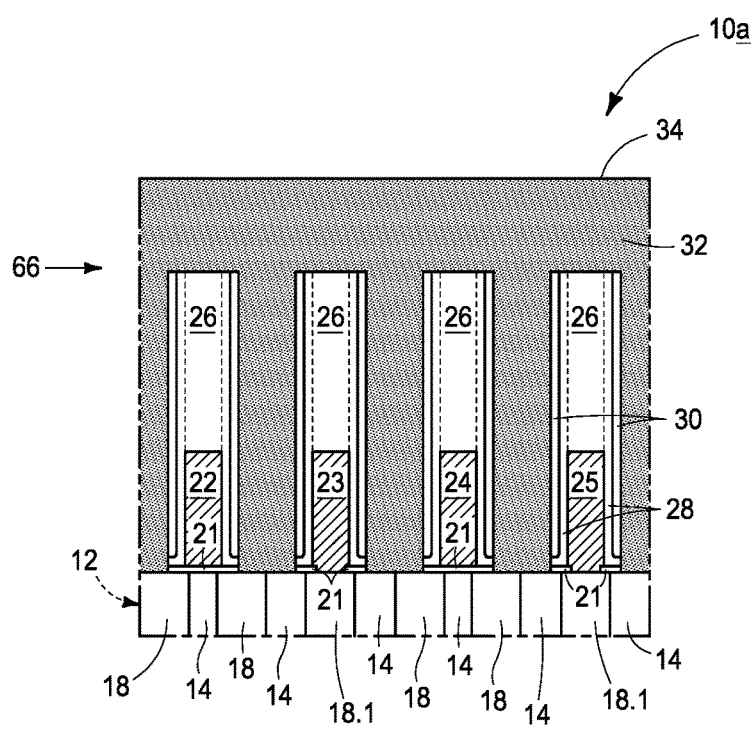
FIG. 106B is a sectional view taken through line 106B-106B in FIG. 106A.
Figure 106C:
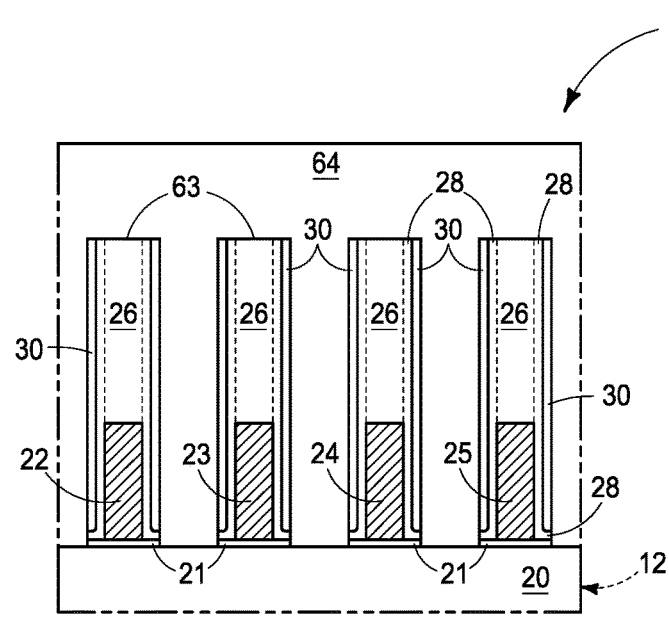
FIG. 106C is a sectional view taken through line 106C-106C in FIG. 106A.
Figure 106D:
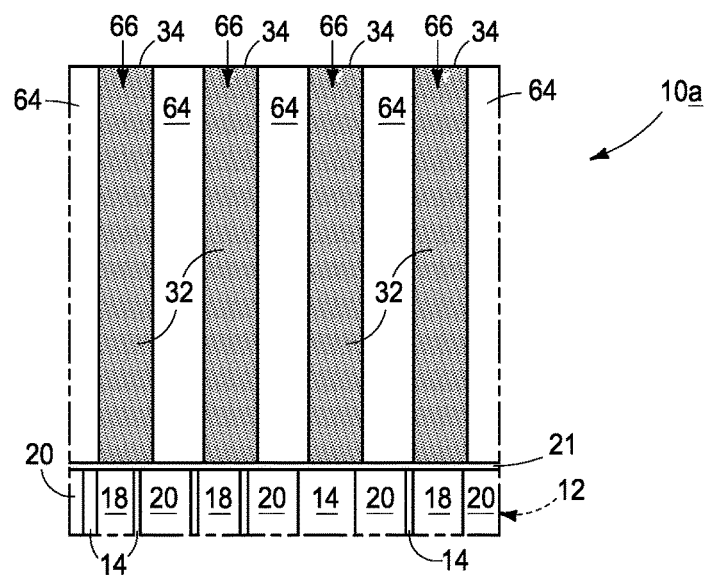
FIG. 106D is a sectional view taken through line 106D-106D in FIG. 106A.
Figure 107A:
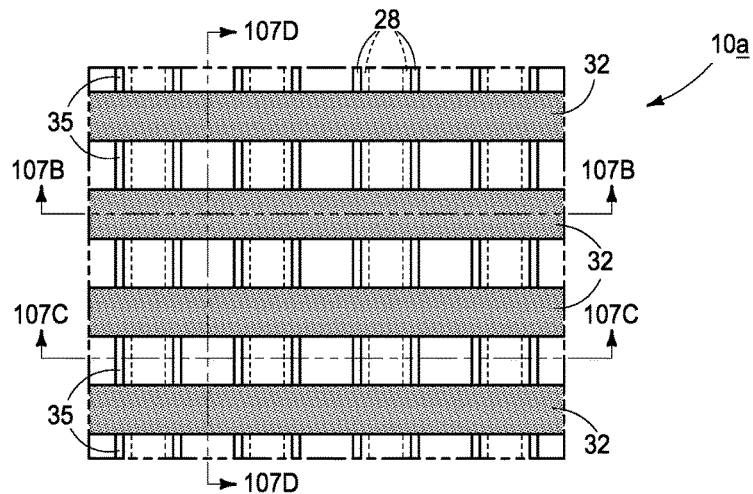
FIG. 107A is a view of the FIG. 106.1A substrate at a processing step subsequent to that shown by FIG. 106.1A.
Figure 107B:
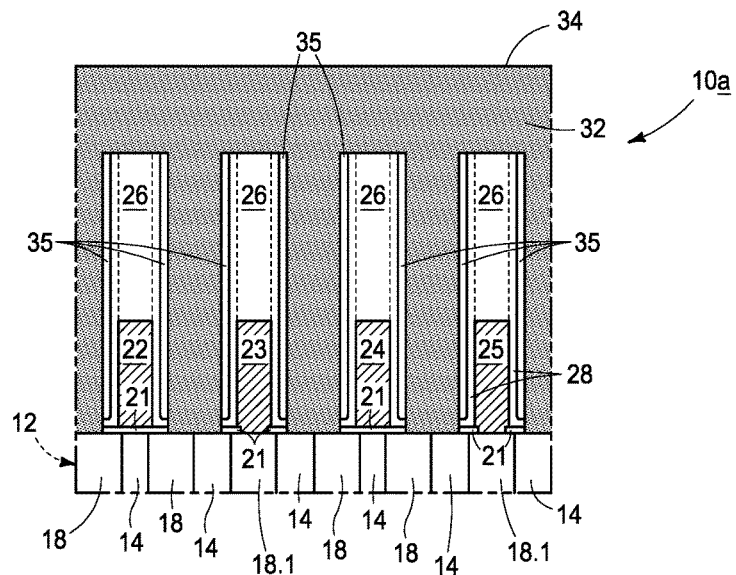
FIG. 107B is a sectional view taken through line 107B-107B in FIG. 107A.
Figure 107C:
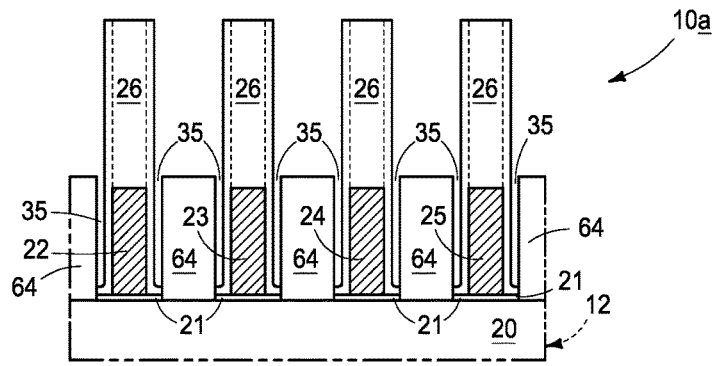
FIG. 107C is a sectional view taken through line 107C-107C in FIG. 107A.
Figure 206A:
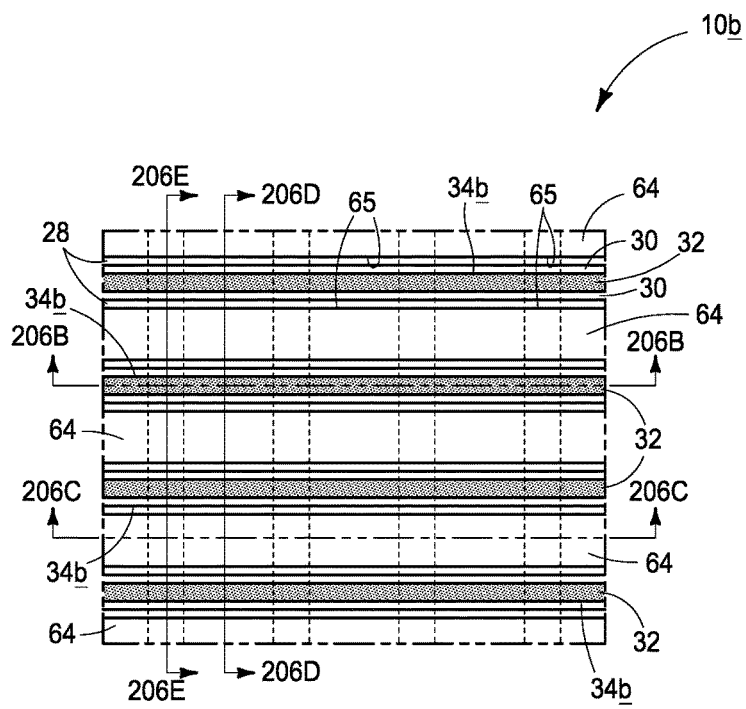
FIG. 206A is a view of the FIG. 204.6A substrate at a processing step subsequent to that shown by FIG. 204.6A.
Figure 206B:
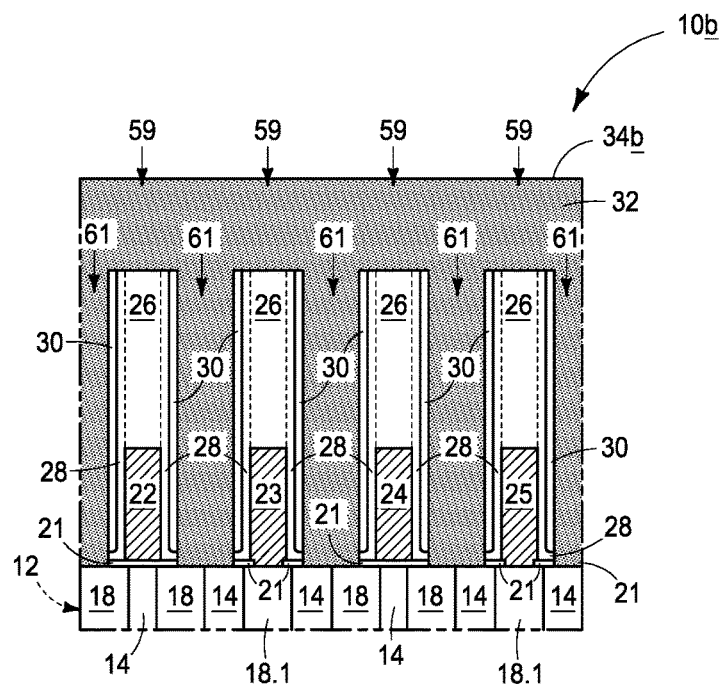
FIG. 206B is a sectional view taken through line 206B-206B in FIG. 206A.
Figure 206C:
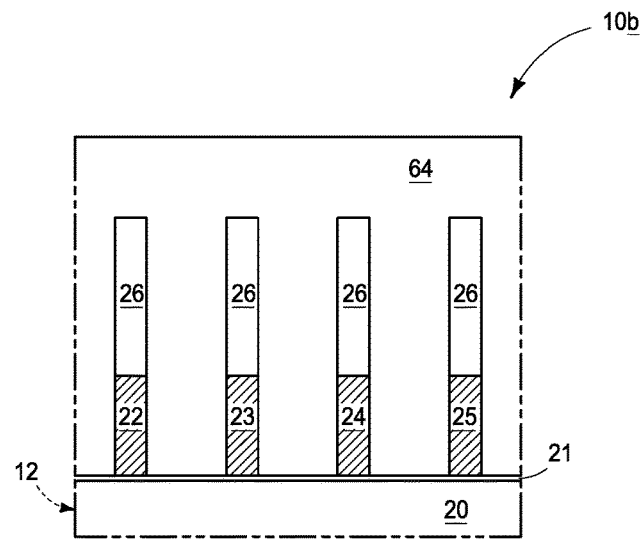
FIG. 206C is a sectional view taken through line 206C-206C in FIG. 206A.
Figure 206D:
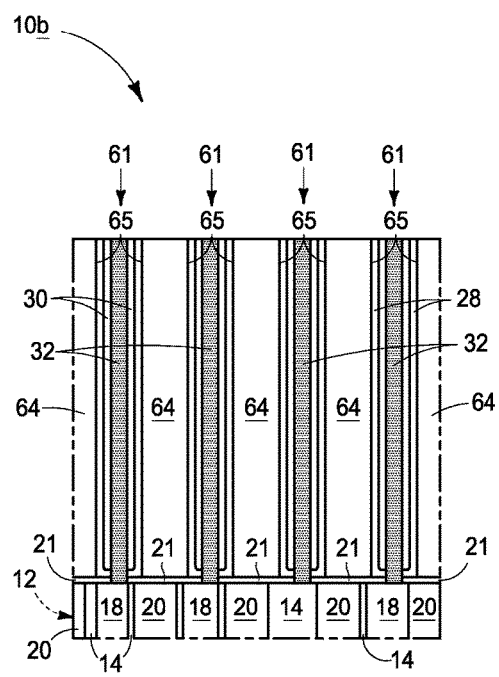
FIG. 206D is a sectional view taken through line 206D-206D in FIG. 206A.
Figure 206E:
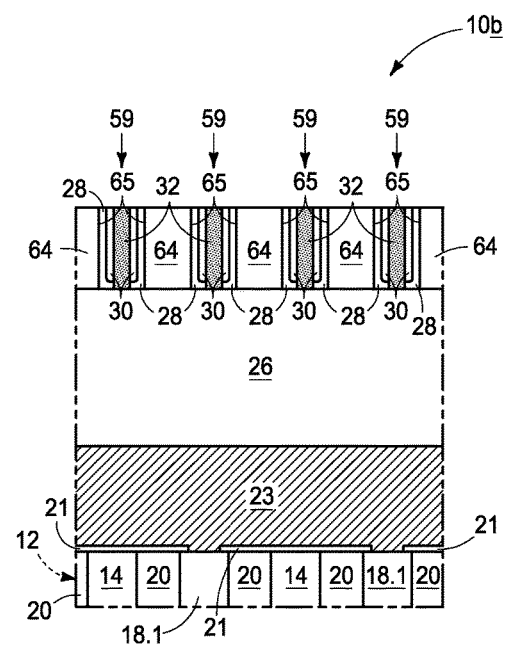
FIG. 206E is a sectional view taken through line 206E-206E in FIG. 206A.

Referring to FIGS. 107A-C, second sacrificial material 30 (not shown) has been removed (e.g., by selective wet isotropic etching) from between conductor material 32 extending elevationally to node location 18 and each of the pair of conductive lines 23, 24 while conductor material line 34 is crossing elevationally over such pair of conductive lines to form a void space 35 laterally between conductor material 32 that is extending elevationally to node location 18 and each of conductive lines 23, 24 in the depicted vertical cross-section. In one embodiment, the etching of dielectric material 64 as described above and perhaps best viewed in FIGS. 106.1B and 106.1C may facilitate removal of second sacrificial material 30 in the processing of FIGS. 107A-C by exposing more of it (e.g., a greater elevational thickness of it from the side) to chemical etching at the beginning and throughout its removal by chemical etching. Alternately, by way of example, dielectric material 64 may only be etched sufficiently in the processing depicted by FIGS. 106.1 to expose very little (not shown) or only the elevationally outermost surfaces of second sacrificial material 30 and using a highly selective (i.e., at least a 10:1 removal rate) wet isotropic etching chemistry/conditions to etch material 30 selectively relative to other exposed materials.

Referring to FIGS. 108A-D, dielectric material 38, 40 is then formed laterally over opposing sidewalls of the elevationally extending conductor material, and ideally to seal void spaces 35. Processing may then proceed as described above or otherwise (not shown for substrate 10a), for example including removing conductor material 32 from crossing elevationally over the pair of conductive lines 23, 24 while leaving at least some conductor material 32 extending elevationally to the node location.

Any other attribute(s) or aspect(s) as shown and/or described above may be used with the embodiments shown and described with respect to FIGS. 104.1A-108D.

The above processing with respect to FIGS. 104.1A-108D formed second sacrificial material 30 over sidewalls of the pair of conductive lines 23, 24 before forming first sacrificial material lines 63. Alternately, second sacrificial material 30 may be formed over sidewalls of the pair of conductive lines 23, 24 after forming first sacrificial material lines 63. In some embodiments, second sacrificial material 30 may be formed immediately before forming conductor material 32, for example as shown with respect to processing of a substrate 10b in FIGS. 204.1A-207.1 (using a series of numerals in the 200's to identify the Figures). Like numerals from the above-described embodiments have been used where appropriate, with some construction differences being indicated with the suffix "b" or with different numerals.

FIGS. 204.1A/B show processing immediately subsequent to the processing shown by FIGS. 2A and 2B and correspond to the processing shown by FIGS. 104.1A and 104.1B wherein first sacrificial material 62 has been formed over substrate 12. However, substrate 10b differs from that of substrate 10a in that dielectric material 28 and second sacrificial material 30 have not been deposited (and accordingly cannot have been etched) prior to deposition of dielectric material 62 in FIGS. 204.1A/B.

Subsequent processing is then shown in FIGS. 204.2A/B/C, FIGS. 204.3A/C/D, and FIGS. 204.4A/B/D/E corresponding to the processing depicted by FIGS. 104.2A/B/C, FIGS. 104.3A/C/D, and FIGS. 104.4A/B/D, respectively. Additional "E" sectional views are added in some places in the 200 series of figures in comparison to the 100 series of figures for further clarity, starting with FIG. 204.4E. For purposes of the continuing discussion, dielectric material 64 may be considered as having opposing sides 65 in FIGS. 204.4D and 204.4E (e.g., in a transverse direction).

Referring to FIGS. 204.5A-E, second sacrificial material 30 (and dielectric material 28) has been formed on opposing sides 65 of dielectric material 64. Such forms shallow openings 59 elevationally over conductive lines 22-25 and deep openings 61 between conductive lines 22-25. Shallow openings 59 and deep openings 61 join/interconnect at their respective longitudinal edges above dielectric material 26 along the B-B section line, as shown. Prior to forming materials 28 and 30, material 64 (and perhaps also material 26) in the construction of FIGS. 204.3A/C/D might be isotropically wet etched selectively relative to other exposed materials to widen/expand (not shown) the resultant openings 59 and 61, particularly in the transverse (e.g., y) direction.

Figure 4B:
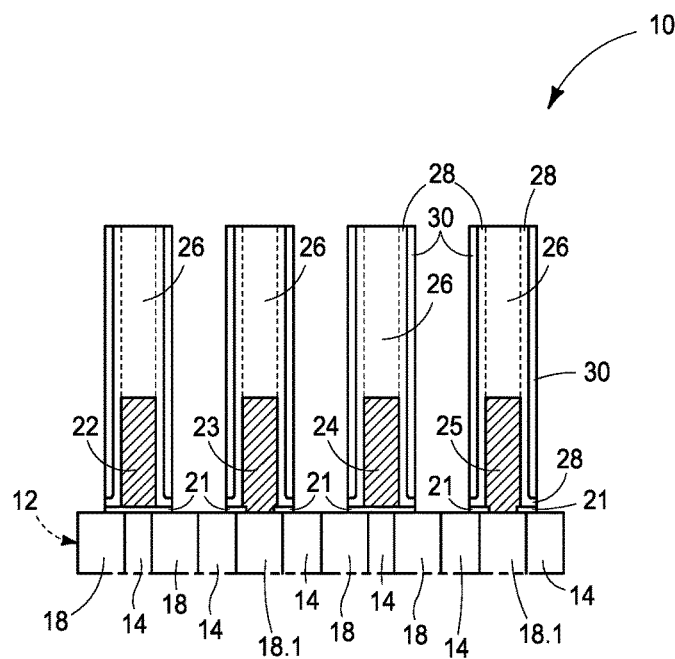
FIG. 4B is a sectional view taken through line 4B-4B in FIG. 4A.

Referring to FIGS. 204.6A-E, materials 28 and 30 have been subjected to a suitable anisotropic etch to substantially remove such materials from being over horizontal surfaces, analogous to the processing depicted by FIGS. 4A and 4B.

Referring to FIGS. 206A-E, conductor material 32 has been deposited to overfill openings 59 and 61 and then planarized back, thus forming conductor material lines 34b analogous to the processing shown and described above with respect to FIGS. 106A/B/D.

Referring to FIGS. 206.1A/C/D/E, and in one embodiment, dielectric materials 64 and 28 have been anisotropically etched elevationally inward selectively relative to conductor material lines 34b and second sacrificial material 30, for example to leave elevationally outermost surfaces 67 of dielectric material 64 higher than such surfaces 69 of conductive lines 23 and 24 as described above with respect to the processing of FIGS. 106.1A/C/D.

Referring to FIGS. 207A-E and 207.1, second sacrificial material 30 (not shown) has been removed (e.g., by wet isotropic etching selectively relative to other exposed materials) to form void spaces 35 as described above. Also, second sacrificial material 30 has been removed from between conductor material 32 extending elevationally to node location 18 and dielectric material 64 on each of opposing sides 65 with respect to elevationally extending conductor material 32 in another vertical cross-section (e.g., that of FIG. 207D) that is orthogonal to the one vertical cross-section (e.g., that of FIG. 207B), thus forming a second void space 75 laterally between conductor material 32 and dielectric material 64 on each of opposing sides 65 in the another vertical cross-section. In one embodiment, void space 35 may be considered as a first void space and void space 75 may be considered as a second void space, with such first and second void spaces joining together into a singular void space encircling that portion of conductor material 32 that is extending elevationally to node location 18, as best viewable in the enlarged FIG. 207.1 section view.

Figure 207A:
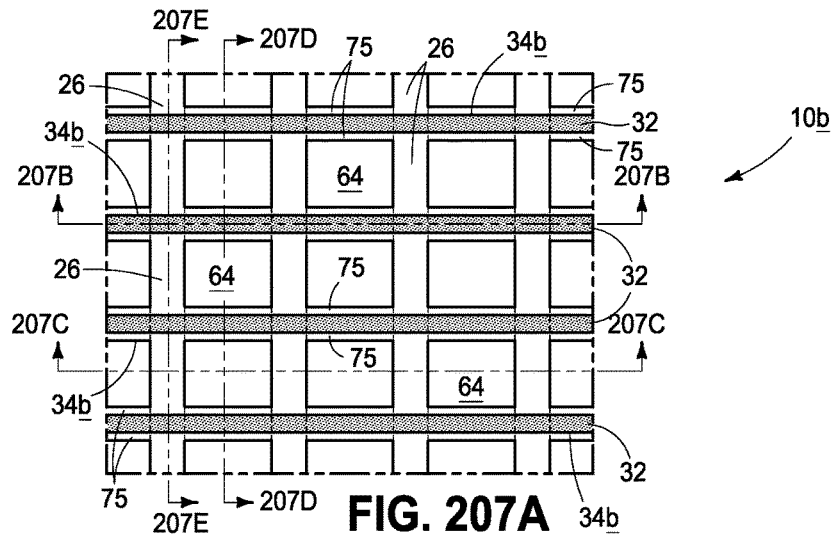
FIG. 207A is a view of the FIG. 206.1A substrate at a processing step subsequent to that shown by FIG. 206.1A.
Figure 207B:
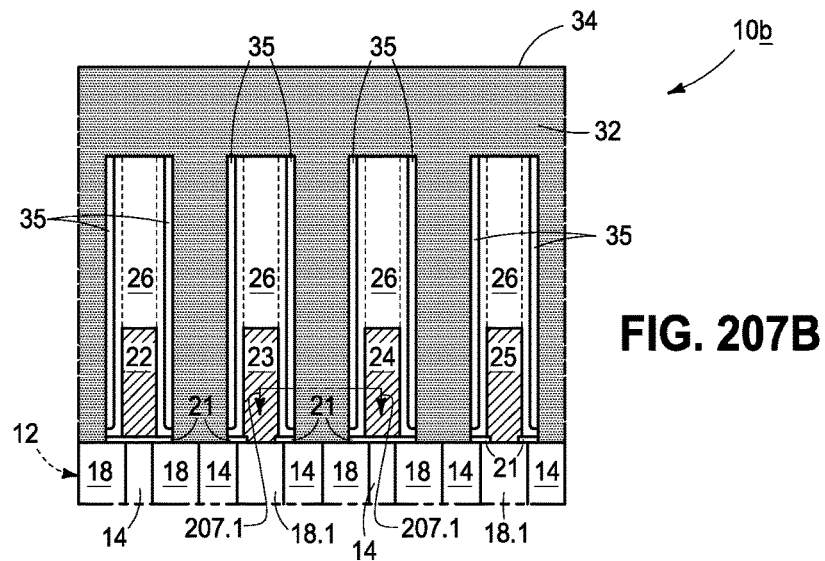
FIG. 207B is a sectional view taken through line 207B-207B in FIG. 207A.
Figure 207C:
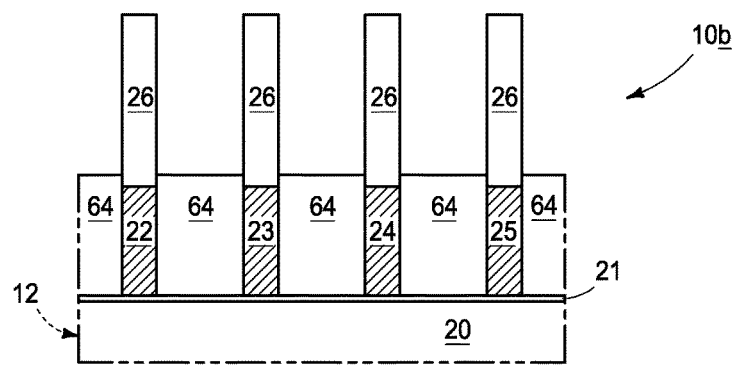
FIG. 207C is a sectional view taken through line 207C-207C in FIG. 207A.

Example conductor material 32 as viewed in FIGS. 207A/D/E/.1 is thinner (e.g., in the depicted "y" direction) than the same conductor material in the above-described embodiments due to the added deposition of second sacrificial material 30 (and material 28) over walls 65 of dielectric material 64 (FIGS. 204.5A-E). Such conductor material can be made wider in the transverse/"y" direction by conducting the optional isotropic wet etch of material 64 referred to above immediately prior to forming materials 28 and 30 in FIGS. 204.5A-E.

Processing may then proceed as described above or otherwise (not shown for substrate 10b), for example including forming dielectric material 38, 40 laterally over opposing sidewalls of the elevationally extending conductor material followed by removing conductor material 32 from crossing elevationally over the pair of conductive lines 23, 24 while leaving at least some conductor material 32 extending elevationally to the node location.

Any other attribute(s) or aspect(s) as shown and/or described above may be used in the FIGS. 204.1A-207.1 embodiments.

Another example method of forming an elevationally extending conductor laterally between a pair of conductive lines is next described with reference to FIGS. 306.1A-D (using a series of numerals in the 300's to identify the Figures) with respect to an alternate embodiment substrate 10c. Like numerals from the above-described embodiments have been used where appropriate, with some construction differences being indicated with the suffix "c" or with different numerals. Such figures show processing immediately subsequent to the processing shown by FIGS. 106A-D and 206A/E and alternate to that shown by FIGS. 106.1A/C/D and 206.1A-E. FIGS. 306.1A-D show processing corresponding to substrate 10a of FIGS. 106A-D, although the same processing could be conducted corresponding to substrate 10b of FIGS. 206A/C/D/E. In substrate 10c, sacrificial material 30 (not shown) and dielectric material 64 (not shown) as shown in FIGS. 106A/C/D/E are of the same composition and whereby all such materials have been removed in a single/same selective etch (e.g., wet isotropic) of such materials selectively relative to other exposed materials, thus again forming void spaces 35. If sacrificial material 30 is deposited and anisotropically etched immediately prior to deposition of conductor material 32, void spaces 75 (not shown) would also form as described above in connection with FIGS. 207A-E. Subsequent processing (not shown for substrate 10c) can occur as described above.

Any other attribute(s) or aspect(s) as shown and/or described above may be used in the FIGS. 306.1A-D embodiments.

CONCLUSION

In some embodiments, a method of forming an elevationally extending conductor laterally between a pair of conductive lines comprises forming a pair of conductive lines spaced from one another in at least one vertical cross-section. Conductor material is formed to elevationally extend laterally between and cross elevationally over the pair of conductive lines in the at least one vertical cross-section. Sacrificial material is laterally between the elevationally extending conductor material and each of the conductive lines of the pair in the at least one vertical cross-section. The sacrificial material is removed from between the elevationally extending conductor material and each of the conductive lines of the pair while the conductor material is crossing elevationally over the pair of conductive lines to form a void space laterally between the elevationally extending conductor material and each of the conductive lines of the pair in the at least one vertical cross-section.

In some embodiments, a method of forming an elevationally extending conductor laterally between a pair of conductive lines comprises forming a pair of conductive lines spaced from one another in at least one vertical cross-section. Sacrificial material is formed over sidewalls of the pair of conductive lines in the at least one vertical cross-section. Conductor material elevationally extends laterally between the pair of conductive lines laterally over the sacrificial material and crosses elevationally over the pair of conductive lines in the at least one vertical cross-section. The elevationally extending conductor material extends to electrically couple to a node location laterally between the pair of conductive lines in the at least one vertical cross-section. The conductor material is subtractively patterned to form a conductor material line having conductor material extending elevationally to the node location laterally between the pair of conductive lines, the conductor material line crossing elevationally over the pair of conductive lines. The sacrificial material is removed from between the conductor material extending elevationally to the node location and each of the conductive lines of the pair while the conductor material line is crossing elevationally over the pair of conductive lines to form a void space laterally between the conductor material that is extending elevationally to the node location and each of the conductive lines of the pair in the at least one vertical cross-section. After forming the void space, the conductor material is removed from crossing elevationally over the pair of conductive lines while leaving at least some of the conductor material extending elevationally to the node location.

In some embodiments, a method of forming an elevationally extending conductor between a pair of conductive lines comprises forming a pair of conductive lines spaced from one another in at least one vertical cross-section. A first sacrificial material line is formed that crosses the pair of conductive lines in the at least one vertical cross-section. The first sacrificial material line comprises first sacrificial material extending elevationally laterally between the pair of conductive lines. Dielectric material is formed on opposing sides of the first sacrificial material line. Second sacrificial material is formed over sidewalls of the pair of conductive lines in the at least one vertical cross-section. The first sacrificial material line is replaced with conductor material to form a conductor material line crossing elevationally over the pair of conductive lines. The conductor material line has conductor material extending elevationally to a node location laterally between the pair of conductive lines in the at least one vertical cross-section. The second sacrificial material is removed from between the conductor material extending elevationally to the node location and each of the conductive lines of the pair while the conductor material line is crossing elevationally over the pair of conductive lines to form a void space laterally between the conductor material that is extending elevationally to the node location and each of the conductive lines of the pair in the at least one vertical cross-section. After forming the void space, the conductor material is removed from crossing elevationally over the pair of conductive lines while leaving at least some of the conductor material extending elevationally to the node location.

In some embodiments, a method comprises forming first and second conductive lines extending substantially parallel to each other with a space there-between. The first conductive line includes a first side surface facing the second conductive line. The second conductive line includes a second side surface facing the first conductive line. First sacrificial material is formed such that the first sacrificial material includes a first portion covering a first part of the first side surface of the first conductive line and a second sacrificial material is formed such that the second sacrificial material includes a second portion covering a second part of the second side surface of the second conductive line. Conductor material is formed to continuously cross over the first and second conductive lines so that the conductor material includes a conductive portion filling a part of the space between the first portion of the first sacrificial material and the second portion of the second sacrificial materials. The first portion of the first sacrificial material and the second portion of the second sacrificial material are removed while keeping the conductor material continuously crossing over the first and second conductive lines to form a first air gap between the conductive portion of the conductor material and the first part of the first side surface of the first conductive line and a second air gap between the conductive portion of the conductor material and the second part of the second side surface of the second conductive line In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an elevationally extending conductor laterally between a pair of conductive lines, comprising:
    forming a pair of conductive lines spaced from one another in at least one vertical cross-section;
    forming conductor material elevationally extending laterally between and crossing elevationally over the pair of conductive lines in the at least one vertical cross-section, sacrificial material being laterally between the elevationally extending conductor material and each of the conductive lines of the pair in the at least one vertical cross-section; and
    removing the sacrificial material from between the elevationally extending conductor material and each of the conductive lines of the pair while the conductor material is crossing elevationally over the pair of conductive lines to form a void space laterally between the elevationally extending conductor material and each of the conductive lines of the pair in the at least one vertical cross-section.

2. The method of claim 1 wherein,
    the pair of conductive lines are formed to extend horizontally; and
    the conductor material is formed to comprise a horizontally extending conductor material line that crosses elevationally over the pair of horizontally extending conductive lines and has the conductor material extending elevationally inward laterally between the pair of conductive lines.

3. The method of claim 2 wherein forming the conductor material line comprises subtractive patterning of the conductor material.

4. The method of claim 2 wherein forming the conductor material line comprises:
forming a trench; and
filling the trench with the conductor material.

5. The method of claim 4 wherein the trench is formed within dielectric material and filling the trench with the conductor material comprises:
overfilling the trench with the conductor material and forming the conductor material elevationally over the dielectric material; and
removing the conductor material from being elevationally over the dielectric material.

6. The method of claim 5 wherein forming the trench comprises:
forming and subtractively patterning placeholder material to have a longitudinal extent and position corresponding to that of the conductor material line;
forming the dielectric material atop and over sidewalls of the patterned placeholder material;
removing the dielectric material elevationally inward to expose an elevationally outermost surface of the patterned placeholder material and leave the dielectric material laterally over the sidewalls of the patterned placeholder material; and
after exposing the elevationally outermost surface of the patterned placeholder material, removing the patterned placeholder material to form the trench.

7. The method of claim 1 wherein,
forming the void space leaves it open, and further comprising sealing the void space from being open before said removing of the conductor material, said removing of the conductor material re-opening the void space, the re-opening leaving the void space to be upwardly open; and
resealing the reopened void space from being upwardly open after said removing of the conductor material.

8. A method of forming an elevationally extending conductor laterally between a pair of conductive lines, comprising:
forming a pair of conductive lines spaced from one another in at least one vertical cross-section;
forming sacrificial material over sidewalls of the pair of conductive lines in the at least one vertical cross-section;
forming conductor material elevationally extending laterally between the pair of conductive lines laterally over the sacrificial material and crossing elevationally over the pair of conductive lines in the at least one vertical cross-section, the elevationally extending conductor material extending to electrically couple to a node location laterally between the pair of conductive lines in the at least one vertical cross-section;
subtractively patterning the conductor material to form a conductor material line having conductor material extending elevationally to the node location laterally between the pair of conductive lines, the conductor material line crossing elevationally over the pair of conductive lines;
removing the sacrificial material from between the conductor material extending elevationally to the node location and each of the conductive lines of the pair while the conductor material line is crossing elevationally over the pair of conductive lines to form a void space laterally between the conductor material that is extending elevationally to the node location and each of the conductive lines of the pair in the at least one vertical cross-section; and
after forming the void space, removing the conductor material from crossing elevationally over the pair of conductive lines while leaving at least some of the conductor material extending elevationally to the node location.

9. The method of claim 8 comprising after forming the void space, forming dielectric material laterally over opposing sidewalls of the elevationally extending conductor material prior to said removing of the conductor material from crossing elevationally over the pair of conductive lines.

10. The method of claim 9 wherein the subtractively patterning the conductor material forms another line of conductor material that is transversally spaced from the conductor material line and which has conductor material extending elevationally inward to another node location that is laterally between the pair of conductive lines, the conductor material of the another line crossing elevationally over the pair of conductive lines, the dielectric material filling space between the conductor material line and the another line.

11. A method of forming an elevationally extending conductor between a pair of conductive lines, comprising:
forming a pair of conductive lines spaced from one another in at least one vertical cross-section;
forming a first sacrificial material line crossing the pair of conductive lines in the at least one vertical cross-section, the first sacrificial material line comprising first sacrificial material extending elevationally laterally between the pair of conductive lines;
forming dielectric material on opposing sides of the first sacrificial material line;
forming second sacrificial material over sidewalls of the pair of conductive lines in the at least one vertical cross-section;
replacing the first sacrificial material line with conductor material to form a conductor material line crossing elevationally over the pair of conductive lines, the conductor material line having conductor material extending elevationally to a node location laterally between the pair of conductive lines in the at least one vertical cross-section;
removing the second sacrificial material from between the conductor material extending elevationally to the node location and each of the conductive lines of the pair while the conductor material line is crossing elevationally over the pair of conductive lines to form a void space laterally between the conductor material that is extending elevationally to the node location and each of the conductive lines of the pair in the at least one vertical cross-section; and
after forming the void space, removing the conductor material from crossing elevationally over the pair of conductive lines while leaving at least some of the conductor material extending elevationally to the node location.

12. The method of claim 11 comprising forming the second sacrificial material over the sidewalls of the pair of conductive lines before forming the first sacrificial material line.

13. The method of claim 11 comprising forming the second sacrificial material over the sidewalls of the pair of conductive lines after forming the first sacrificial material line.

14. The method of claim 11 comprising after said replacing, etching the dielectric material elevationally inward selectively relative to the conductor material line before said removing of the conductor material.

15. The method of claim 14 wherein the etching leaves an elevationally outermost surface of the dielectric material that is elevationally higher than that of conductive material of the pair of conductive lines.

16. The method of claim 15 wherein the conductive lines of the pair have a dielectric material there-atop that is of different composition from that of the dielectric material.

17. The method of claim 11 wherein the void space comprises a first void space, and further comprising:
forming the second sacrificial material on opposing sides of the dielectric material before said replacing, said removing of the second sacrificial material also removing the second sacrificial material from between the conductor material extending elevationally to the node location and the dielectric material on each of opposing sides of the elevationally extending conductor material in another vertical cross-section that is orthogonal to the one vertical cross-section to form a second void space laterally between the conductor material that is extending elevationally to the node location and the dielectric material on each of the opposing sides of the elevationally extending conductor material in the another vertical cross-section, the first and second void spaces joining together into a singular void space encircling the conductor material that is extending elevationally to the node location.

18. The method of claim 11 comprising wherein the first sacrificial material is predominately carbon.

19. The method of claim 18 wherein the removing of the second sacrificial material to form the void space comprises isotropically wet etching the second sacrificial material selectively relative to the conductor material and the dielectric material.

20. The method of claim 18 wherein the second sacrificial material and the dielectric material are the same in composition, the removing of the second sacrificial material to form the void space comprises isotropically wet etching the second sacrificial material and the dielectric material selectively relative to the conductor material and the dielectric material in the same etching step.

21. The method of claim 18 wherein the second sacrificial material and the dielectric material are different in composition; and
further comprising after said replacing, etching the dielectric material elevationally inward selectively relative to the conductor material line before said removing of the conductor material, the etching leaving an elevationally outermost surface of the dielectric material that is elevationally higher than that of conductive material of the pair of conductive lines.

22. A method comprising:
forming first and second conductive lines extending in substantially parallel to each other with a space therebetween, the first conductive line including a first side surface facing the second conductive line, the second conductive line including a second side surface facing the first conductive line;
forming first sacrificial material such that the first sacrificial material includes a first portion covering a first part of the first side surface of the first conductive line and forming second sacrificial material such that the second sacrificial material includes a second portion covering a second part of the second side surface of the second conductive line;
forming conductor material to continuously cross over the first and second conductive lines so that the conductor material includes a conductive portion filling a part of the space between the first portion of the first sacrificial material and the second portion of the second sacrificial materials; and
removing the first portion of the first sacrificial material and the second portion of the second sacrificial material while keeping the conductor material continuously crossing over the first and second conductive lines to form a first air gap between the conductive portion of the conductor material and the first part of the first side surface of the first conductive line and a second air gap between the conductive portion of the conductor material and the second part of the second side surface of the second conductive line.

23. The method of claim 22,
wherein the first sacrificial material is elongated along the first side surface so that the first sacrificial material further includes a third portion covering a third part of the first side surface and the second sacrificial material is elongated along the second side surface so that the second sacrificial material further includes a fourth portion covering a fourth part of the second side surface;
wherein the forming conductor material comprises:
forming a conductor layer over an entire surface; and
patterning the conductor layer so that the third portion of the first sacrificial material and the fourth portion of the second sacrificial material are exposed; and
wherein the removing the first portion of the first sacrificial material and the second portion of the second sacrificial materials comprises subjecting exposed third portion of the first sacrificial material and exposed fourth portion of the second sacrificial material to an etchant for sacrificial material.

24. The method of claim 22,
wherein the first sacrificial material is elongated along the first side surface so that the first sacrificial material further includes a third portion covering a third part of the first side surface and the second sacrificial material is elongated along the second side surface so that the second sacrificial material further includes a fourth portion covering a fourth part of the second side surface;
wherein the method further comprises:
before forming the conductive material, forming dielectric material to define an area in which the conductor material is to be formed; and
after forming the conductive material, removing the dielectric material so that the third portion of the first sacrificial material and the fourth portion of the second sacrificial material are exposed; and
wherein the removing the first portion of the first sacrificial material and the second portion of the second sacrificial materials comprises subjecting exposed third portion of the first sacrificial material and exposed fourth portion of the second sacrificial material to an etchant for sacrificial material.

25. The method of claim 22,
wherein the method further comprises:
before forming the first and second sacrificial materials, forming first and second dielectric materials extending in substantially parallel to each to cross over each other of the first and second conductive lines, the first dielectric material including a third side surface facing the second dielectric material, and the second dielectric material including a fourth side surface facing the first dielectric material;

before forming the conductive material, forming third sacrificial material covering a part of the third side surface of the first dielectric material and fourth sacrificial material covering a part of the fourth side surface of the second dielectric material, the third sacrificial material merging with each of the first and second sacrificial materials and the fourth sacrificial material merging with each of the first and second sacrificial materials; and after forming the conductor material, removing the first and second dielectric materials so that the third and fourth sacrificial materials are exposed; and wherein the removing the first portion of the first sacrificial material and the second portion of the second sacrificial materials comprises subjecting exposed third and fourth sacrificial materials to an etchant for sacrificial material.

\* \* \* \* \*